(12) United States Patent
Blank et al.

(10) Patent No.: US 11,699,610 B2
(45) Date of Patent: *Jul. 11, 2023

(54) ROTATIONAL INDEXER WITH ADDITIONAL ROTATIONAL AXES

(71) Applicant: Lam Research Corporation, Fremont, CA (US)

(72) Inventors: Richard M. Blank, San Jose, CA (US); Karl Frederick Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/049,030

(22) Filed: Oct. 24, 2022

(65) Prior Publication Data

US 2023/0063281 A1 Mar. 2, 2023

Related U.S. Application Data

(63) Continuation of application No. 15/733,348, filed as application No. PCT/US2019/013000 on Jan. 10, (Continued)

(51) Int. Cl.
*H01L 21/677* (2006.01)
*H01L 21/68* (2006.01)
*H01L 21/687* (2006.01)

(52) U.S. Cl.
CPC .. *H01L 21/67796* (2013.01); *H01L 21/67706* (2013.01); *H01L 21/67742* (2013.01); (Continued)

(58) Field of Classification Search
CPC ..... H01L 21/68764; B25J 9/043; B25J 9/042; B25J 18/007
See application file for complete search history.

(56) References Cited

U.S. PATENT DOCUMENTS 4,507,046 A 3/1985 Sugimoto et al.
4,551,058 A 11/1985 Mosher
(Continued)

FOREIGN PATENT DOCUMENTS

EP 0774323 A2 5/1997
JP H0734928 Y 8/1995
(Continued)

OTHER PUBLICATIONS

European Examination report dated Jun. 22, 2022 in Application No. EP20190738454.
(Continued)

*Primary Examiner* — Gerald McClain
(74) *Attorney, Agent, or Firm* — Weaver Austin Villeneuve & Sampson LLP

(57) ABSTRACT

A rotational indexer rotatable to move semiconductor wafers or other items between various stations arranged in a circular array. The items being moved may be supported by arms of the indexer during such movement. The rotational indexer may be further configured to also cause the items being moved to rotate about other rotational axes to cause rotation of the items relative to the arms supporting them.

20 Claims, 15 Drawing Sheets

Related U.S. Application Data 2019, now Pat. No. 11,482,436, which is a continuation of application No. 15/867,599, filed on Jan. 10, 2018, now Pat. No. 10,109,517.

(52) U.S. Cl.
CPC ........ *H01L 21/67745* (2013.01); *H01L 21/68* (2013.01); *H01L 21/68764* (2013.01)

(56) References Cited

U.S. PATENT DOCUMENTS

| | | | |
|---|---|---|---|
| 4,620,831 A | 11/1986 | Poncet et al. | |
| 4,629,860 A | 12/1986 | Lindbom | |
| 4,787,813 A | 11/1988 | Stevens et al. | |
| 4,921,395 A | 5/1990 | Sahlin | |
| 5,195,388 A | 3/1993 | Zona et al. | |
| 5,591,295 A * | 1/1997 | Onitsuka | H01L 21/67144 156/557 |
| 5,667,592 A | 9/1997 | Boitnott et al. | |
| 5,738,574 A * | 4/1998 | Tolles | B24B 53/017 451/247 |
| 5,795,448 A | 8/1998 | Hurwitt et al. | |
| 5,804,507 A * | 9/1998 | Perlov | B24B 37/04 438/692 |
| 5,855,465 A | 1/1999 | Boitnott et al. | |
| 6,126,381 A | 10/2000 | Bacchi et al. | |
| 6,199,444 B1 | 3/2001 | Wakaizumi et al. | |
| 6,287,386 B1 | 9/2001 | Perlov et al. | |
| 6,319,553 B1 | 11/2001 | McInerney et al. | |
| 6,629,883 B2 | 10/2003 | Katsuoka et al. | |
| 6,827,789 B2 | 12/2004 | Lee et al. | |
| 6,860,965 B1 | 3/2005 | Stevens | |
| 7,189,647 B2 | 3/2007 | Patton et al. | |
| 7,241,203 B1 * | 7/2007 | Chen | B24B 27/0023 451/283 |
| 7,374,525 B2 | 5/2008 | Massaro | |
| 8,137,162 B2 | 3/2012 | Abrahamians et al. | |
| 8,137,465 B1 | 3/2012 | Shrinivasan et al. | |
| 8,961,099 B2 | 2/2015 | Blank et al. | |
| 9,050,623 B1 * | 6/2015 | Varadarajan | H01L 21/67115 |
| 9,190,307 B2 | 11/2015 | Tan et al. | |
| 9,190,907 B2 | 11/2015 | Philbrick et al. | |
| 9,252,038 B2 | 2/2016 | Nakao et al. | |
| 9,511,348 B2 | 12/2016 | Ma et al. | |
| 9,511,438 B2 | 12/2016 | Sato et al. | |
| 9,797,042 B2 | 10/2017 | Nowak et al. | |
| 10,109,517 B1 | 10/2018 | Blank et al. | |
| 10,946,634 B2 | 3/2021 | Li et al. | |
| 11,111,085 B2 * | 9/2021 | Malivoir | B25J 11/00 |
| 11,355,367 B2 * | 6/2022 | Schaller | H01L 21/68792 |
| 11,482,436 B2 | 10/2022 | Blank et al. | |
| 2001/0033144 A1 | 10/2001 | Doi | |
| 2002/0098072 A1 | 7/2002 | Sundar | |
| 2005/0282472 A1 | 12/2005 | Jeong | |
| 2007/0031236 A1 * | 2/2007 | Chen | H01L 21/6719 414/935 |
| 2007/0034479 A1 | 2/2007 | Todaka | |
| 2007/0207014 A1 | 9/2007 | Toshima | |
| 2007/0261726 A1 | 11/2007 | Rye et al. | |
| 2011/0114258 A1 | 5/2011 | Chau et al. | |
| 2013/0019078 A1 | 1/2013 | Sandler | |
| 2013/0210238 A1 | 8/2013 | Yudovsky | |
| 2015/0059811 A1 | 3/2015 | Holmes et al. | |
| 2015/0083550 A1 * | 3/2015 | Wilson | B65G 29/00 198/377.01 |
| 2015/0179488 A1 | 6/2015 | Blank | |
| 2015/0332912 A1 | 11/2015 | Nowak et al. | |
| 2016/0122872 A1 | 5/2016 | Kato et al. | |
| 2016/0137427 A1 | 5/2016 | Dansberg et al. | |
| 2016/0138159 A1 | 5/2016 | Kato et al. | |
| 2016/0236345 A1 | 8/2016 | Yoshino | |
| 2017/0076972 A1 | 3/2017 | Krishnan et al. | |
| 2017/0113345 A1 | 4/2017 | Shimada et al. | |
| 2018/0010250 A1 | 1/2018 | Nowak et al. | |
| 2018/0323064 A1 | 11/2018 | Jung et al. | |
| 2020/0089104 A1 | 3/2020 | Marks et al. | |
| 2020/0326627 A1 | 10/2020 | Jiang et al. | |

FOREIGN PATENT DOCUMENTS

| | | |
|---|---|---|
| JP | H09174420 A | 7/1997 |
| JP | 2001287187 A | 10/2001 |
| JP | 4951201 B2 * | 6/2012 |
| JP | 2015220458 A | 12/2015 |
| JP | 2016096220 A | 5/2016 |
| KR | 0145258 B1 | 8/1998 |
| KR | 102110726 B1 | 6/2020 |
| WO | WO-2018004646 A1 | 1/2018 |
| WO | WO-2019217749 A1 | 11/2019 |

OTHER PUBLICATIONS

Extended European Search Report dated Aug. 17, 2021 for application 19738454.8, 5 pages.
International Preliminary Report on Patentability dated Jul. 23, 2020 in PCT/US2019/013000.
International Search Report and Written Opinion dated Mar. 24, 2022 in PCT/US2019/013000.
International Search Report and Written Opinion (ISA/KR) dated May 8, 2019 in PCT/US2019/013000.
JP Office Action dated May 10, 2022, in Application No. JP20200538140 with English translation.
Korean Office Action dated Oct. 10, 2019 in KR Application No. 10-2019-7004545.
KR Office Action dated Dec. 23, 2022 in Application No. KR10-2020-7013032 with English translation.
KR Office Action dated Feb. 25, 2022, in Application No. KR1020207013032 with English translation.
U.S. Non-Final Office Action dated Apr. 4, 2022 in U.S. Appl. No. 15/733,348.
U.S. Notice of Allowance dated Jun. 13, 2022, in U.S. Appl. No. 15/733,348.
U.S. Notice of Allowance dated Jun. 18, 2018 in U.S. Appl. No. 15/867,599.

* cited by examiner

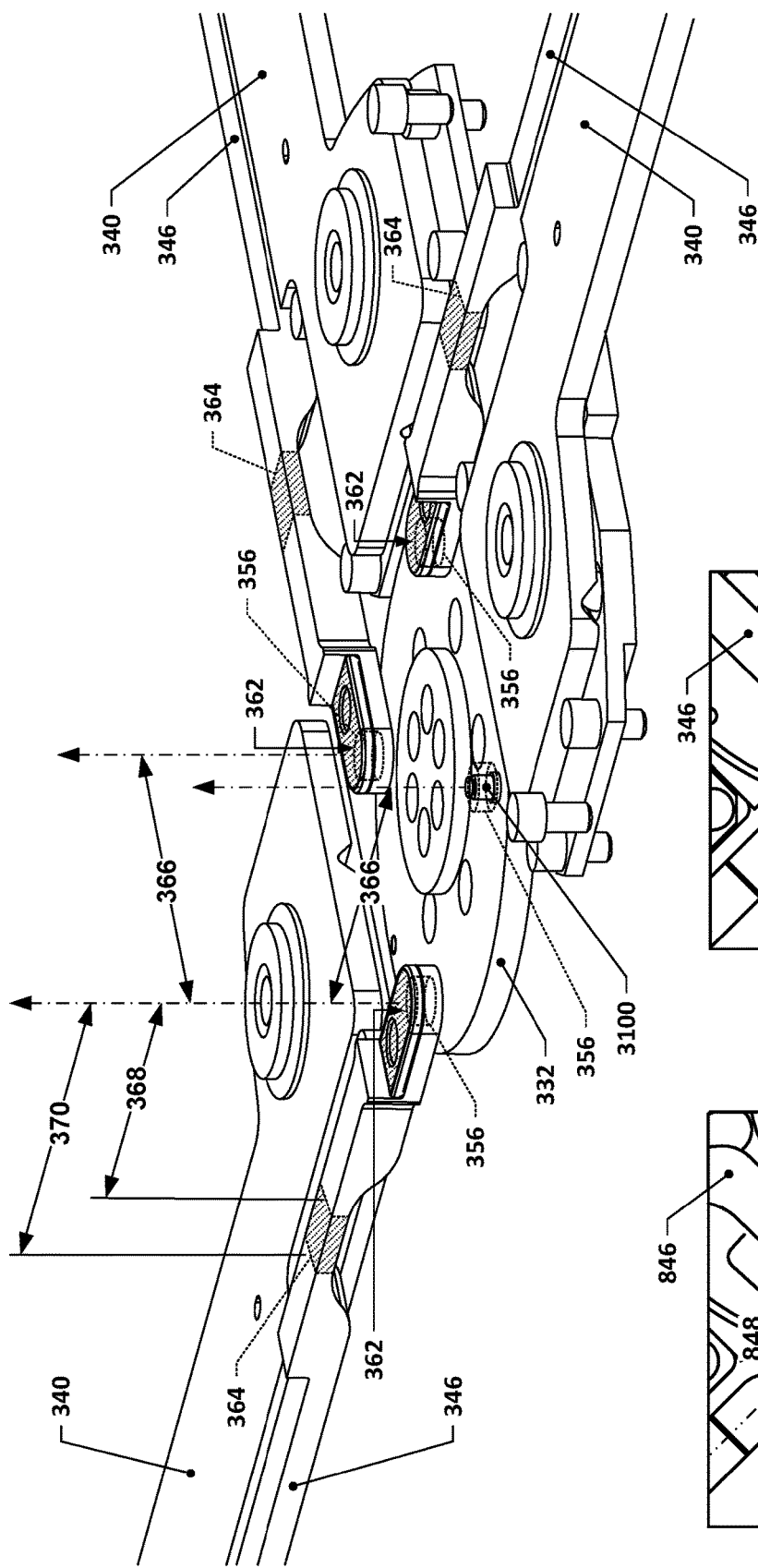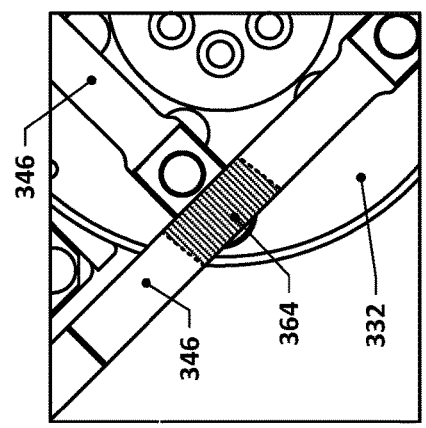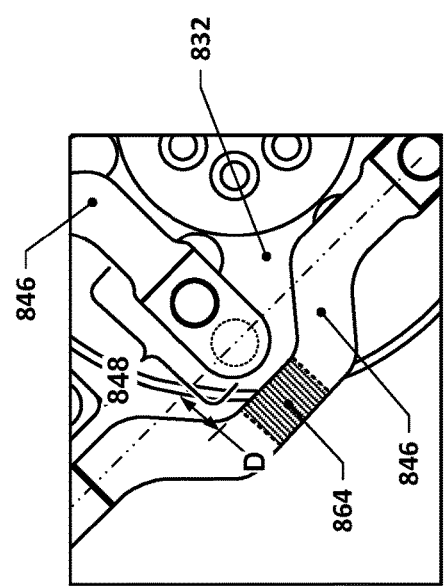
FIG. 7
FIG. 8
FIG. 9

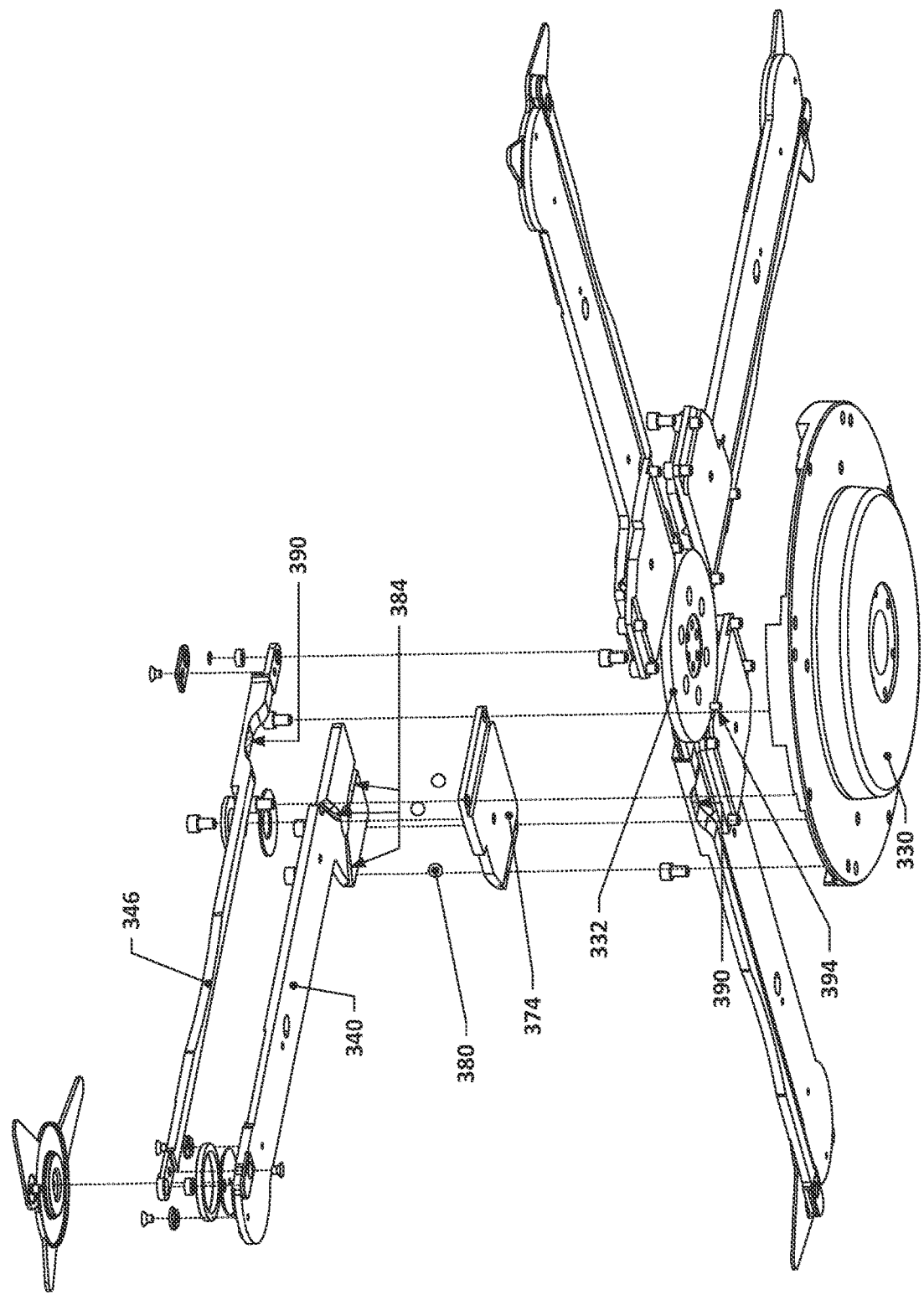

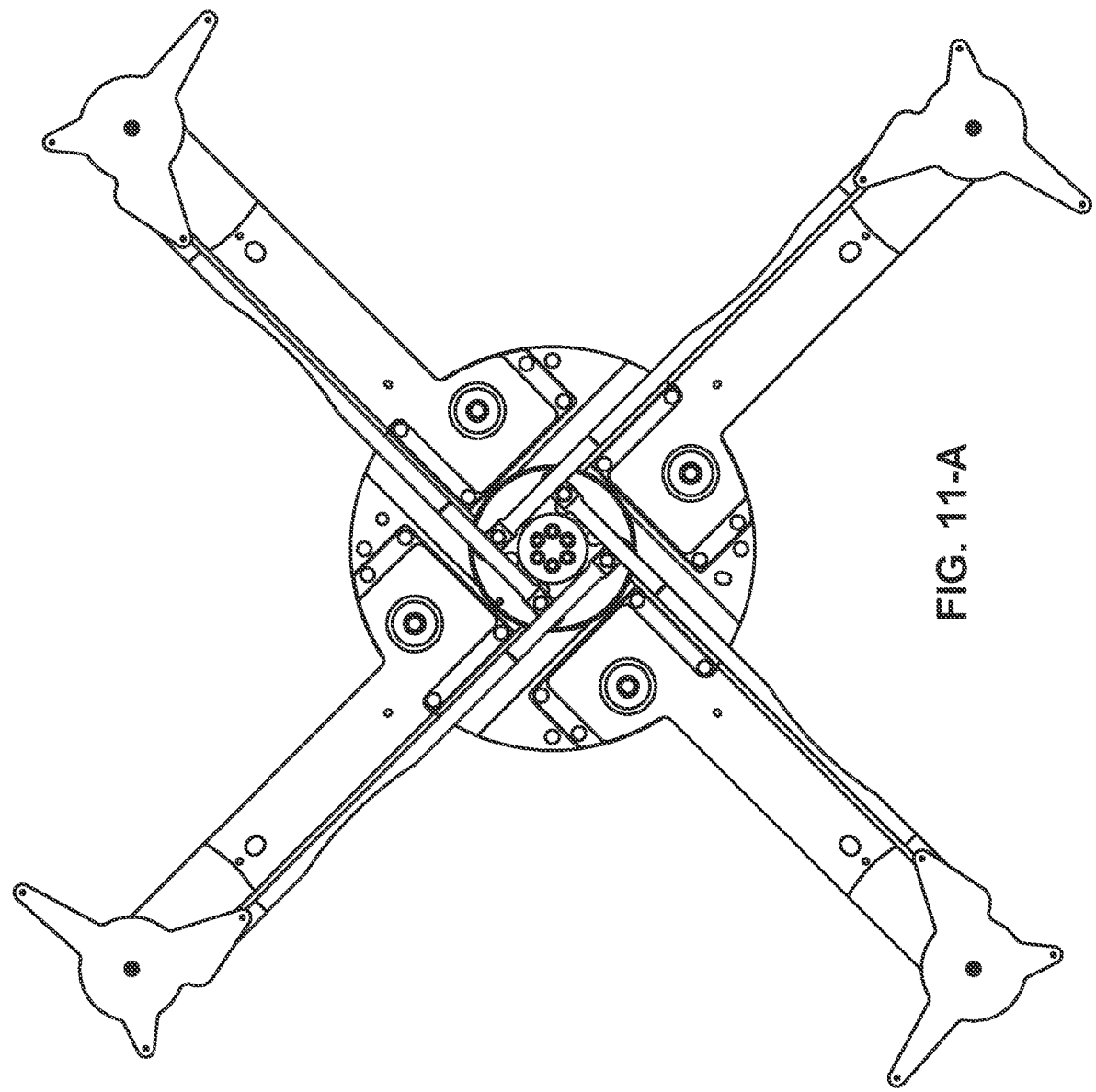
FIG. 11-A

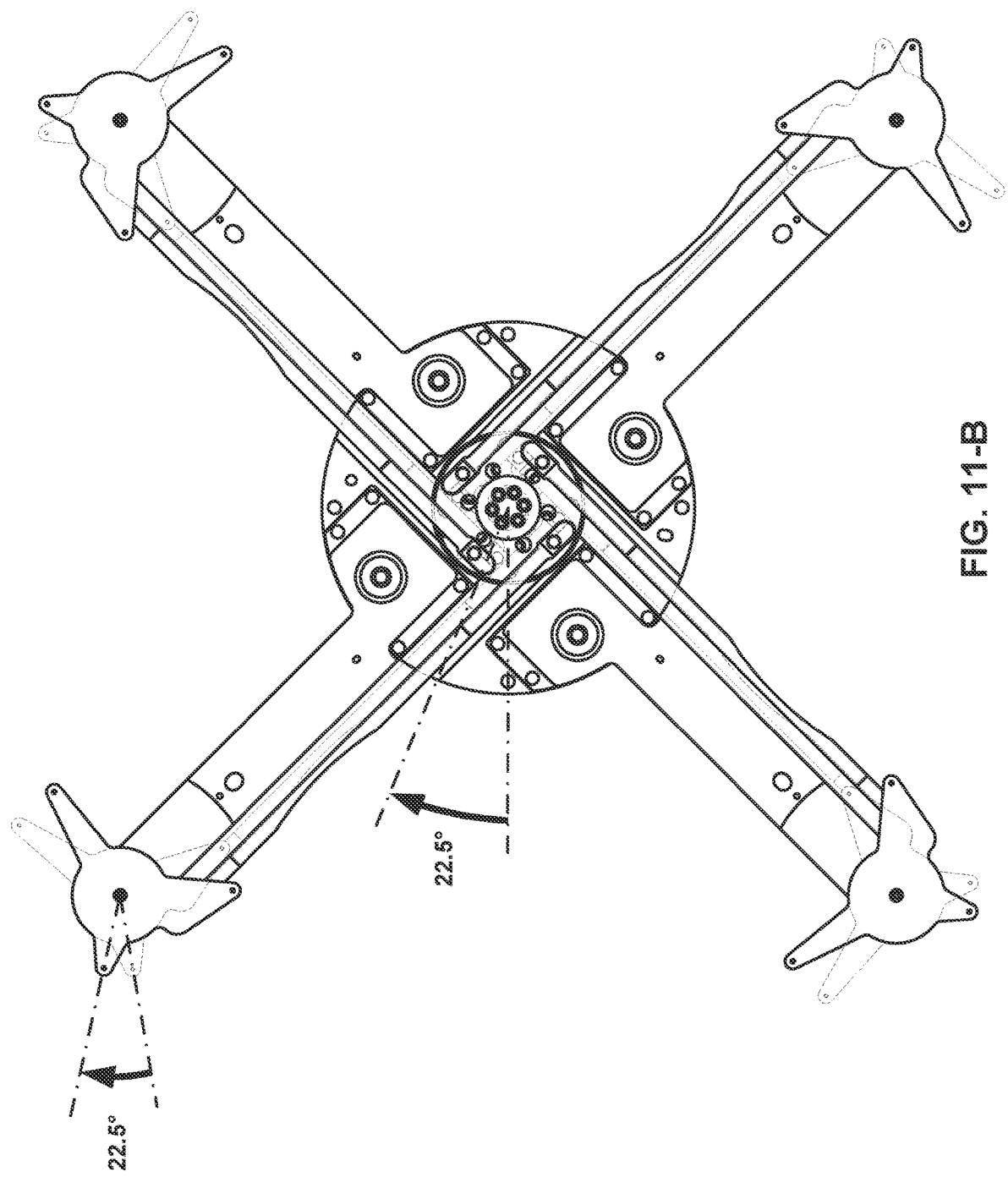
FIG. 11-B

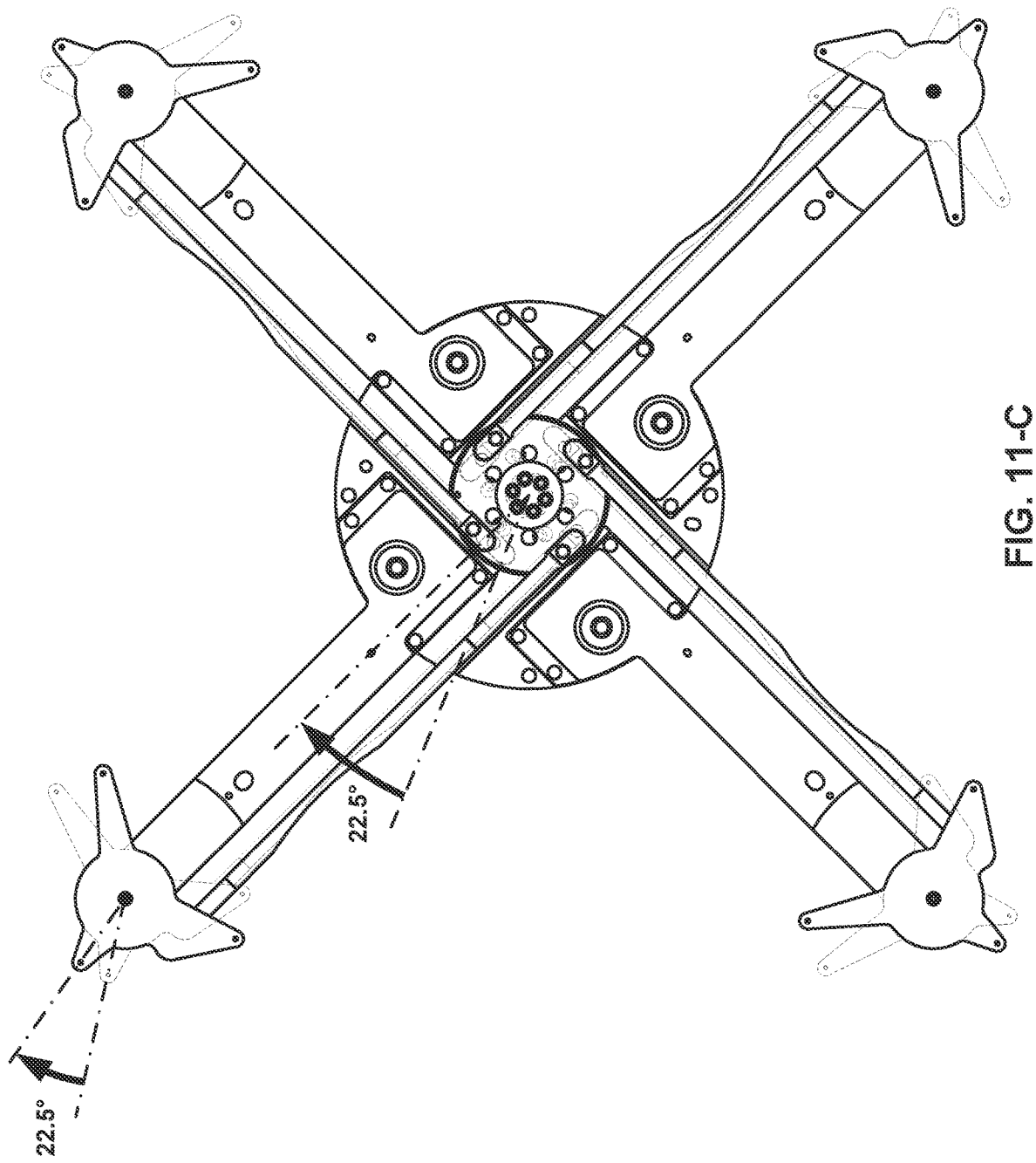
FIG. 11-C

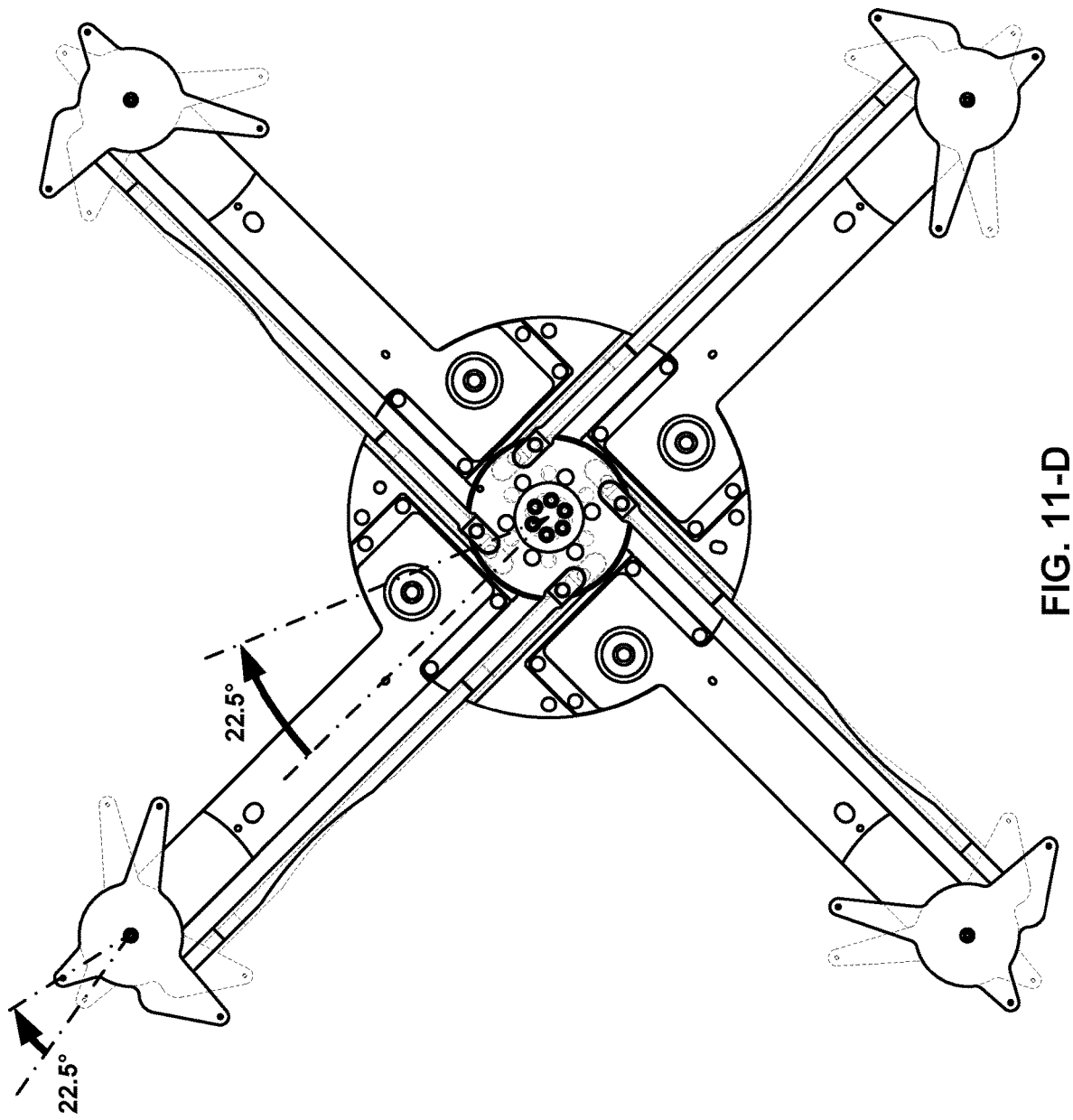
FIG. 11-D

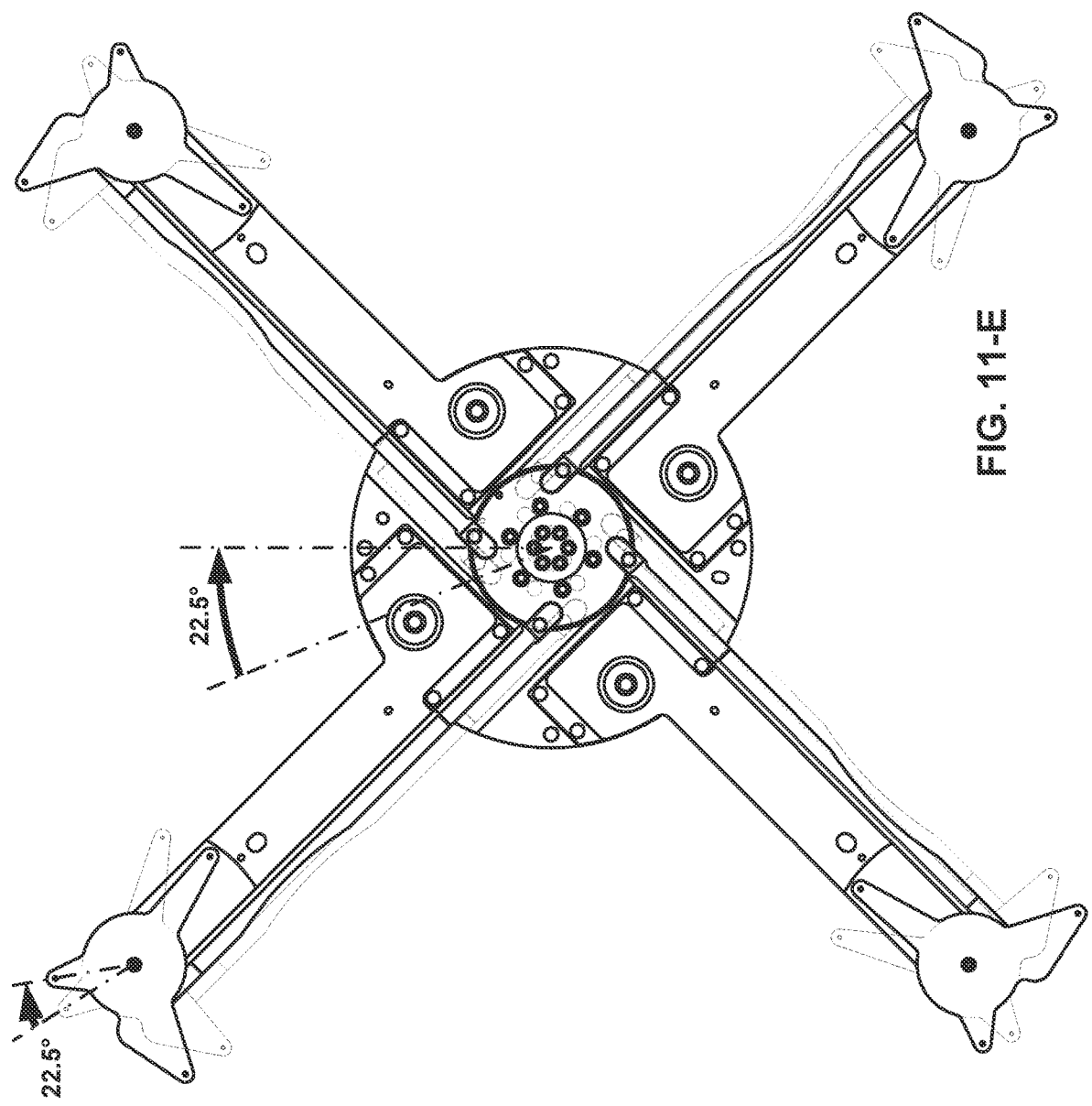
FIG. 11-E

ROTATIONAL INDEXER WITH ADDITIONAL ROTATIONAL AXES

CROSS-REFERENCE TO RELATED APPLICATION(S)

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Some semiconductor processing tools process multiple wafers within a common chamber simultaneously and use a rotational indexer to move wafers from processing station to processing station within the chamber. In such semiconductor processing tools, the processing stations may generally be laid out such that the wafer center points are equidistantly spaced along a circular path. A rotational indexer that includes a central hub and multiple arms that radiate outwards from that central hub may be used to move the wafers from station to station; the end of the arms may have some form of wafer support that may be used to support wafers being moved by the indexer. Moving the wafers from station to station using such a device is referred to as "indexing" the wafers. Generally, the number and angular spacing of the arms on the indexer will correspond with the number and angular spacing of the processing stations about the circular path's center point. For example, in a four-station chamber, there may be four arms on the indexer, each oriented at 90° from the adjacent arms. Wafers may be placed on the arms and the central hub and the arms connected thereto may be rotated as a unit about the center point of the circular path, thereby moving the wafers from station to station.

SUMMARY

Details of one or more implementations of the subject matter described in this specification are set forth in the accompanying drawings and the description below. Other features, aspects, and advantages will become apparent from the description, the drawings, and the claims.

In some implementations, an apparatus may be provided that includes a base, a first motor, a second motor, and a first hub. The first motor may be configured to rotate the first hub about a center axis of the first hub and relative to the base, and the apparatus may further include N indexer arm assemblies, each indexer arm assembly including a) a wafer support and b) an indexer arm having a proximal end connected with the first hub and a distal end rotatably connected with the wafer support. Each wafer support may be configured to rotate relative to the indexer arm that supports it about a rotational axis of that wafer support. N may be selected such that there are two or more indexer arm assemblies. The apparatus may further include an actuation mechanism that may be configured to actuated by the second motor and that may be further configured to cause the wafer supports of the indexer arms to simultaneously rotate about the corresponding rotational axes of the wafer supports and relative to the indexer arms responsive to rotation of the first motor, the second motor, or the first motor and the second motor.

In some implementations of the apparatus, the actuation mechanism may include a second hub that is configured to rotate about the center axis of the first hub responsive to actuation by the second motor, and each indexer arm assembly may further include a tie-rod with a proximal end that is rotatably connected with the second hub by a first rotatable interface and a distal end that is rotatably connected with the wafer support of that indexer arm assembly by a second rotatable interface. In such implementations, the actuation mechanism and indexer arm assemblies may be configured such that relative rotation between the first hub and the second hub about the first center axis causes the tie-rods to translate in a generally radial manner relative to the first center axis, thereby causing each tie-rod to rotate the wafer support to which that tie-rod is rotatably connected to rotate relative to the indexer arms and about the rotational axis of that wafer support.

In some implementations of the apparatus, the first hub and the second hub may be configured to be rotatable relative to each other from a first relative rotational position to a second relative rotational position.

In some implementations of the apparatus, the indexer arms, the tie-rods, and the wafer supports may be made of a ceramic material.

In some implementations of the apparatus, each indexer arm assembly may include a third rotatable interface that rotatably connects the wafer support for that indexer arm assembly with the indexer arm for that indexer arm assembly, and the first rotatable interfaces, the second rotatable interfaces, and the third rotatable interfaces may all be ceramic ball bearings.

In some implementations of the apparatus, there may be four indexer arm assemblies. Moreover, each of the wafer supports may be in a third relative rotational position with respect to the first hub when the first hub and the second hub are in the first relative rotational position and in a fourth relative rotational position with respect to the first hub when the first hub and the second hub are in the second relative rotational position; the third relative rotational positions and the fourth relative rotational positions may be 90° out of phase with one another in such an implementation.

In some implementations of the apparatus, the apparatus may include a stop mechanism that is configured to limit relative rotational motion between the first hub and the second hub to between 90° and 95°.

In some implementations of the apparatus, the proximal end of each tie-rod may have an uppermost surface directly above the first rotatable interface for that tie-rod, each first rotatable interface may be horizontally spaced apart from the nearest other first rotatable interface by a first distance, each tie-rod may include an offset region extending between a first longitudinal distance from a rotational center of the first rotatable interface for that tie-rod and a second longitudinal distance from the rotational center of the first rotatable interface for that tie-rod, the first longitudinal distances may be less than the first distances and the second longitudinal distances are greater than the first distances, and the offset region of each tie-rod may have a lowermost surface that is higher than the uppermost surface of the distal end of the tie-rod from an adjacent indexer arm assembly, thereby allowing the distal end of the tie-rod from the adjacent indexer arm assembly to pass underneath that tie-rod when the first hub and the second hub are in the first relative rotational position.

In some implementations of the apparatus, each of the wafer supports may be in a third relative rotational position with respect to the first hub when the first hub and the second hub are in the first relative rotational position and in a fourth relative rotational position with respect to the first hub when the first hub and the second hub are in the second relative rotational position; in such implementations, the third relative rotational positions and the fourth relative rotational positions may be 360°/N out of phase with one another.

In some implementations of the apparatus, the hub may include a separate mounting interface for each indexer arm assembly, each mounting interface may include a tensionable interface and three conical recesses arranged around the tensionable interface. A sphere may be nestled in each conical recess and each indexer arm may include an aperture through which the tensionable interface protrudes and three grooves radiating outward relative to the aperture. Each sphere of the corresponding mounting interface may also be nestled in a corresponding groove of that indexer arm, and the tensionable interfaces may each be configured to compress the spheres between a corresponding one of the indexer arms and a corresponding one of the mounting interfaces.

In some implementations of the apparatus, the tensionable interface associated with each indexer arm may include a threaded component and a spring that is configured to compress that indexer arm against the spheres interposed between that indexer arm and the mounting interface that connects that indexer arm with the first hub when the threaded component is tightened and placed in tension.

In some implementations of the apparatus, the apparatus may further include a motor housing containing the first motor and the second motor and supporting the first hub via a first hub rotational interface, and may also include a z-axis drive system configured to translate the motor housing along a vertical axis responsive to actuation of the z-axis drive system.

In some implementations of the apparatus, the apparatus may further include a semiconductor processing chamber housing, the semiconductor processing chamber housing having N processing stations, each processing station including a pedestal configured to support a semiconductor wafer.

In some implementations of the apparatus, the processing stations may be configured for performing a semiconductor processing operation selected from the group consisting of: deposition operations, etch operations, curing operations, and heat treatment operations.

In some implementations of the apparatus, the apparatus may further include a controller having a memory and one or more processors. The memory and the one or more processors may be communicatively connected, the one or more processors may be configured to control the first motor and the second motor, and the memory may store computer-executable instructions for controlling the one or more processors to cause one or more of the first motor, the second motor, and the first motor and the second motor to be selectively actuated to cause: the first hub and the indexer arm assemblies to rotate such that each wafer support moves from a corresponding one of the processing stations to a neighboring processing station of the processing stations, first relative rotational motion between the first hub and the second hub such that each wafer support rotates about the rotational axis of that wafer support and relative to the first hub by a first amount in a first direction during movement from processing station to processing station, while the wafer supports are resident at each processing station, or during both movement from processing station to processing station and while the wafer supports are resident at each processing station, and second relative rotational motion between the first hub and the second hub such that each wafer support rotates about the rotational axis of that wafer support and relative to the first hub by a first amount in a second direction opposite the first direction during movement from processing station to processing station, while the wafer supports are resident at each processing station, or during both movement from processing station to processing station and while the wafer supports are resident at each processing station.

In some implementations of the apparatus, N may equal 4 and the memory may store further computer-executable instructions for controlling the one or more processors to cause the first motor to rotate the first hub by 90° in the first direction while the second hub is kept stationary.

In some implementations, a method may be provided that includes a) picking a plurality of wafers up off of a corresponding plurality of pedestals using an indexer having a corresponding plurality of wafer supports, each wafer support rotatably mounted to a distal end of an indexer arm of the indexer and each indexer arm mounted to a hub of the indexer, wherein the wafers are supported by the wafer supports; b) rotating the hub and the indexer arms about a first rotational axis to move each wafer support from a position above each of the pedestals to a position above an adjacent one of the pedestals; c) placing the wafers onto the pedestals after (b); and d) rotating the wafer supports relative to the indexer arms and about rotational axes of wafer supports in between (a) and (c).

In some implementations of such a method, the indexer may have four indexer arms and (b) may include rotating the hub and the indexer arms by 90° and (d) may include rotating the wafer supports relative to the indexer arms by 90°.

Other features, aspects, and advantages will become apparent from the description, the drawings, and the claims. Note that the relative dimensions of the following figures may not be drawn to scale.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIG. 7 depicts a detail view of the center of the example rotational indexer of FIG. 3 with some additional components removed.

FIG. 8 depicts a detail top view of a portion of an example second hub and tie-rods, showing overlap between two tie-rods in a particular configuration.

FIG. 9 depicts a detail top view of a portion of another example second hub and tie-rods, showing an alternate tie-rod design.

FIG. 10 depicts a perspective, partially-exploded view of the example rotational indexer of FIG. 3 showing the underside of the example rotational indexer.

FIGS. 11-A through 11-E show the example rotational indexer of FIG. 3 through various states of actuation of the rotatable wafer supports located at the distal ends of the indexer arms.

FIGS. 3-12 are drawn to-scale within each Figure, although the scale may vary from Figure to Figure. The Figures depict only an example of the concepts discussed herein, and it will be readily appreciated that the concepts discussed herein may be implemented in a large number of alternate implementations, all of which are considered to be within the scope of this disclosure.

DETAILED DESCRIPTION

Importantly, the concepts discussed herein are not limited to any single aspect or implementation discussed herein, nor to any combinations and/or permutations of such aspects and/or implementations. Moreover, each of the aspects of the present invention, and/or implementations thereof, may be employed alone or in combination with one or more of the other aspects and/or implementations thereof. For the sake of brevity, many of those permutations and combinations will not be discussed and/or illustrated separately herein.

The rotational indexers with additional rotational axes disclosed herein differ from conventional rotational indexers in that they possess additional degrees of rotational freedom at the distal ends of the indexer arms. For example, in a conventional indexer, the only rotation that is provided is of the entire hub/arm structure about the center axis of the indexer—as a result, when the hub/arm structure is rotated, the items carried at the end of each arm rotate in the same manner about the same rotational axis. This causes the items, e.g., semiconductor wafers, to maintain the same orientation with respect that that rotational axis—for example, the same portion of each item will always be closest to the rotational center axis.

Figure 1:
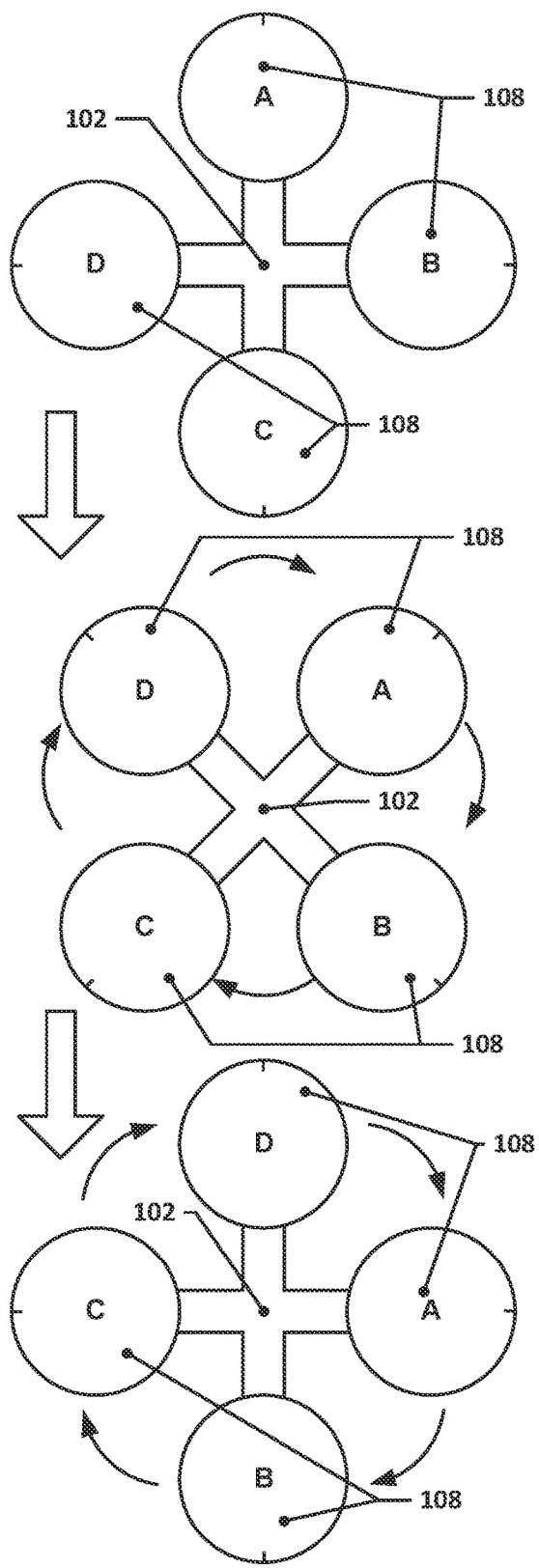
FIG. 1 is a schematic diagram showing wafer rotation in a conventional rotational indexer.

This may be seen in FIG. 1, which is a schematic diagram showing wafer rotation in a conventional rotational indexer. Three indexer positions are shown—the starting position is at top, an intermediate position in the middle, and a terminal position at the bottom (this is for a single set of wafer movements from the positions shown at top to the positions shown at bottom). Each wafer 108 has a short line/mark at the outermost edge; then the indexer 102 is rotated, all four wafers 108 rotate about the rotational axis of the indexer 102. As a result, the edges of the wafers 108 with the lines/marks remain the edges of the wafers furthest from the rotational axis of the indexer 102 throughout the rotational movement. Put another way, the orientation of each wafer relative to the arm that supports it remains unchanged.

Indexers according to the present disclosure, however, are able to provide for additional degrees of rotational motion such that the orientation of the wafers relative to the arms can be altered during, before, and/or after rotational movement of the indexer. As a result, the edges or portions of the edges of the wafers closest to the indexer rotational axis may be changed so that different sides of the wafers may be located closest to the rotational center of the indexer at each station. Thus, such indexers may not only "index" the wafer between different positions, but may also "spin" the wafers during, before, or after such "indexing" movement.

Figure 2:
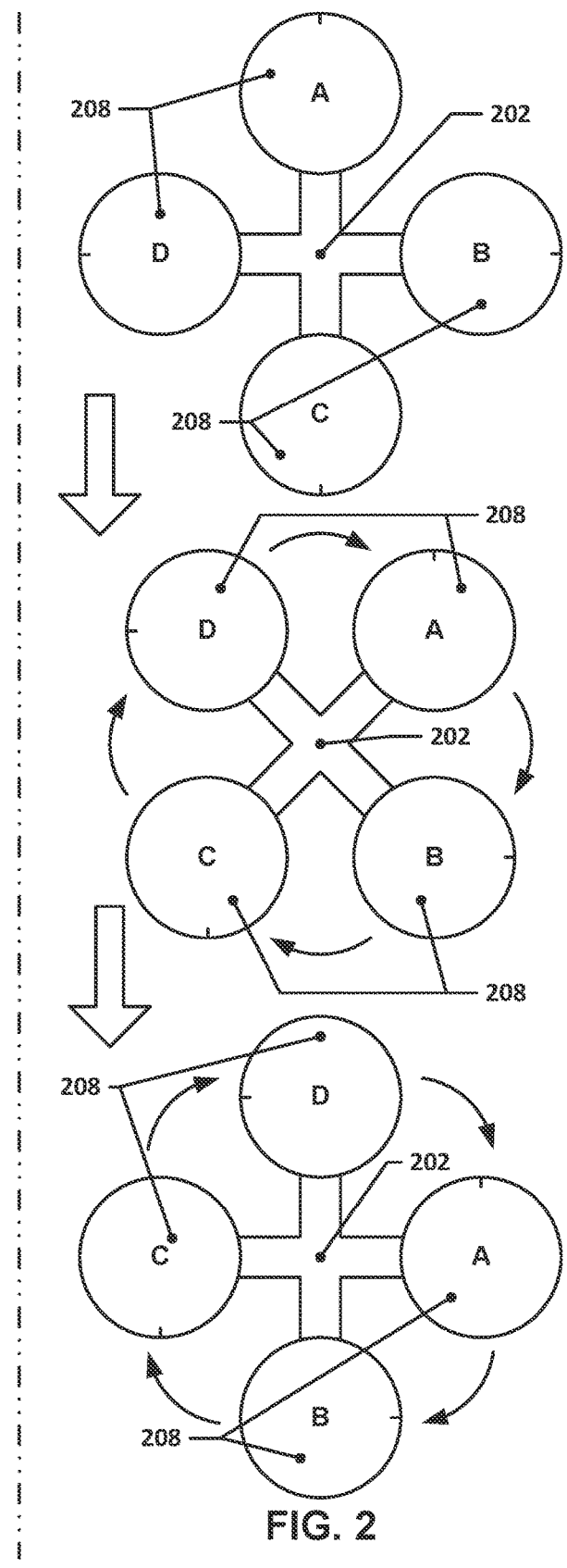
FIG. 2 is a schematic diagram showing wafer rotation supported by a rotational indexer with additional rotational axes, as discussed herein.

This may be seen in FIG. 2, which is a schematic diagram showing wafer rotation supported by a rotational indexer with additional rotational axes, as discussed above and elsewhere herein. FIG. 2 has a similar layout to FIG. 1, with three positions of a rotational indexer 202 shown, along with wafers 208. As can be seen in the topmost position, the short lines/marks along the outer edges of the wafers 208 are all furthest from the rotational center of the indexer 202 and are generally aligned with the arms of the indexer 208. In the middle position, the indexer 202 has rotated 45° clockwise, but the wafers 208 have also been rotated by the same amount in a counterclockwise direction. As a result, the orientation of each wafer 208 relative to the arm that supports it changes, with the wafers 208 being rotated by 90° relative to the arms in the lower position. This causes different edges of the wafers 208 to be furthest from the rotational center of the indexer 202 than in the top position in FIG. 2.

Figure 3:
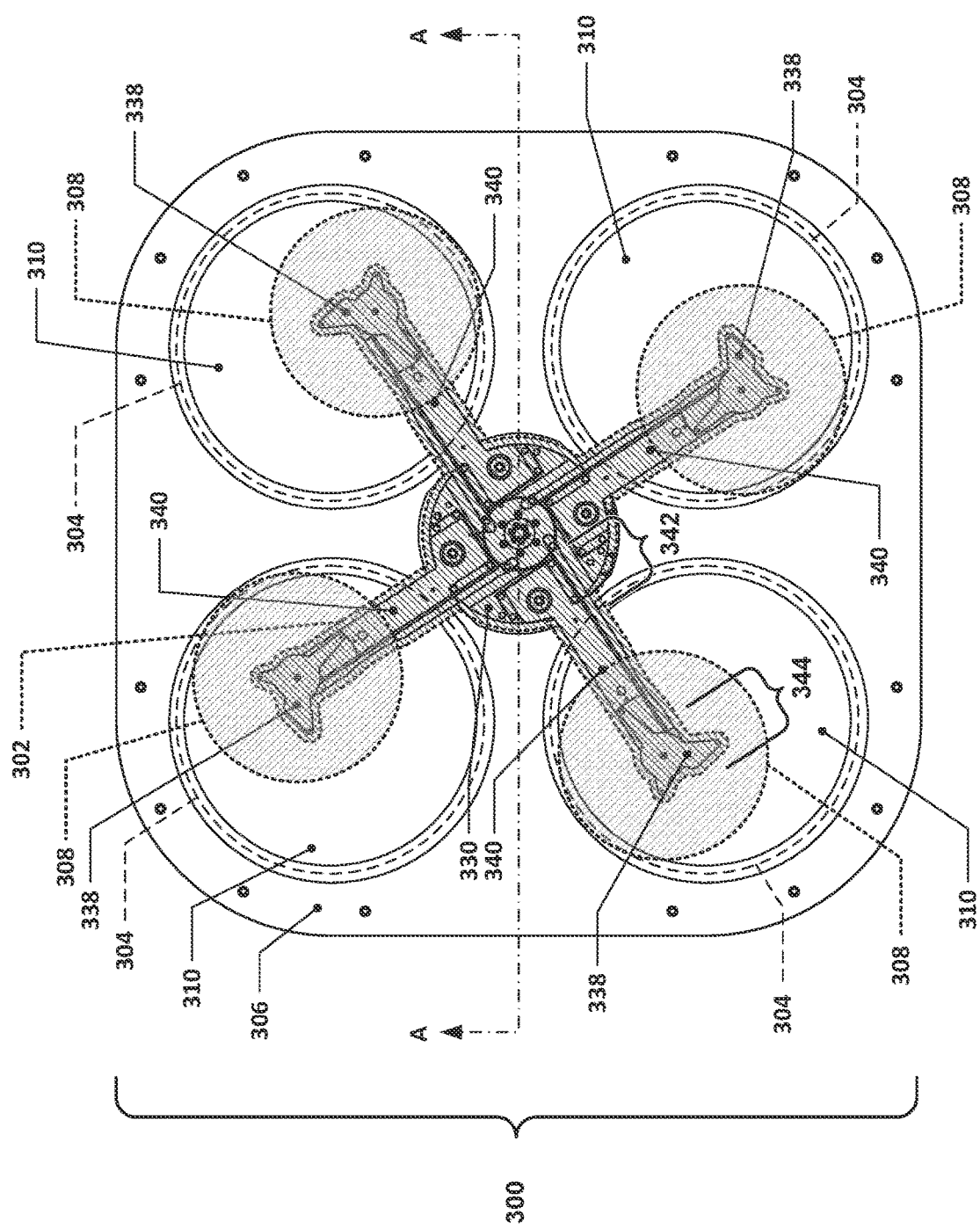
FIG. 3 depicts a top view of part of an example semiconductor processing tool having a rotational indexer that is an example of the rotational indexers discussed herein.
Figure 5:
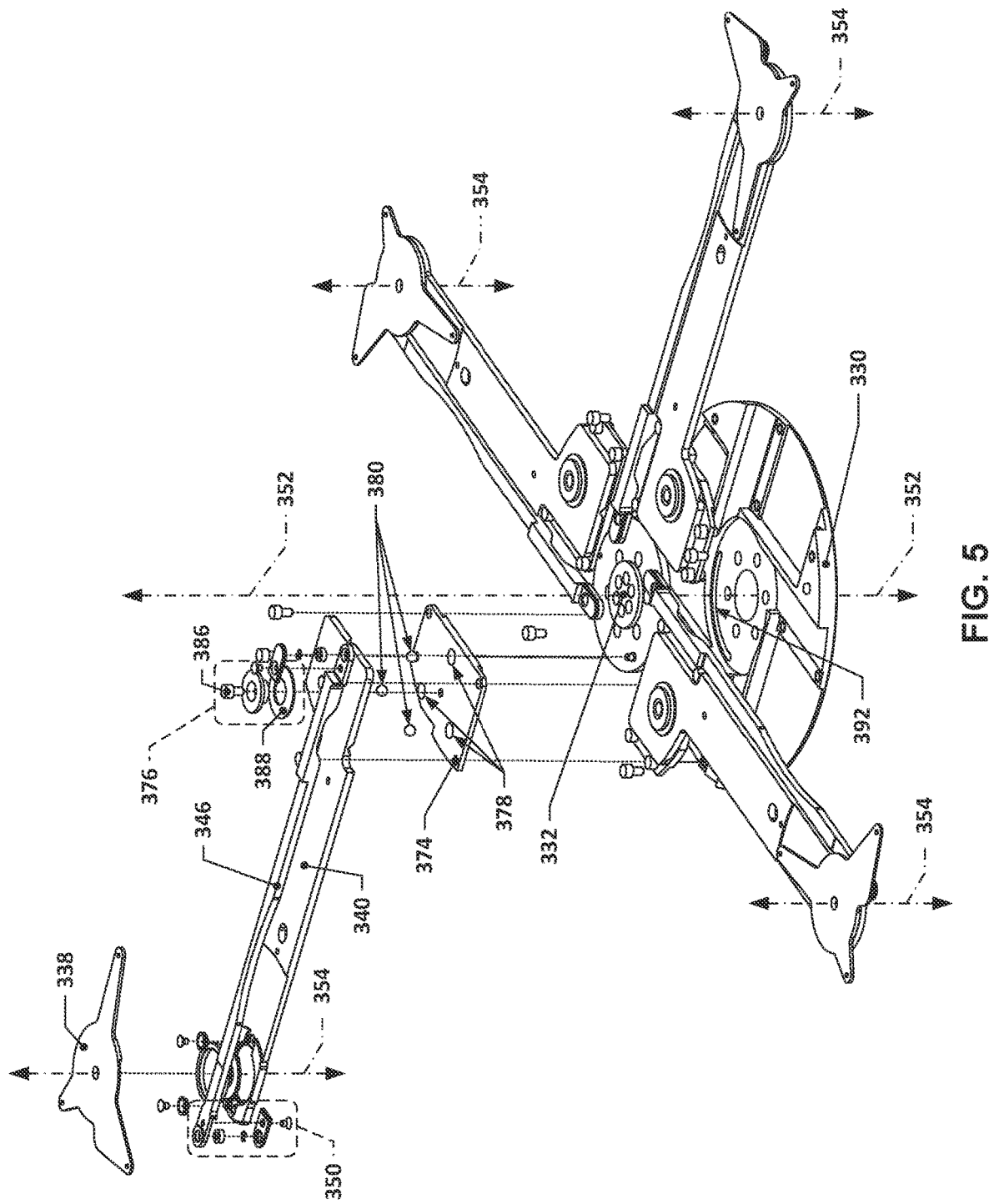
FIG. 5 depicts another perspective, partially-exploded view of the example rotational indexer of FIG. 3.

FIG. 3 depicts a top view of part of an example semiconductor processing tool having a rotational indexer that is an example of the rotational indexers discussed herein. In FIG. 3, a semiconductor processing tool 300 is shown that has a processing chamber 306 that includes four semiconductor processing stations 304, each of which has a pedestal 310. The semiconductor processing stations 304 are arranged in a radial or circular array about a center axis, and a rotational indexer 302 is provided that is configured to rotate about that center axis. The rotational indexer 302 may have a plurality of indexer arms 340, e.g., four indexer arms in this example, that are attached to a first hub 330 at a proximal end 342 such that when the first hub 330 is rotated about the center axis (see center axis 352 in FIG. 10), the arms 340 rotate with it. Distal ends 344 of the indexer arms 340 may be provided with wafer supports 338, each of which may be configured to be rotatable relative to the indexer arm 340 that supports it and about a rotational axis that is located at that distal end 344 (such rotational axes are depicted in FIG. 5 as rotational axes 354). Each wafer support 338 may be configured to support a wafer 308 (wafers 308 are shown in dotted outline to allow components of the indexer arms to be more easily seen) during movement of the wafers 308 between processing stations 304.

Figure 4:
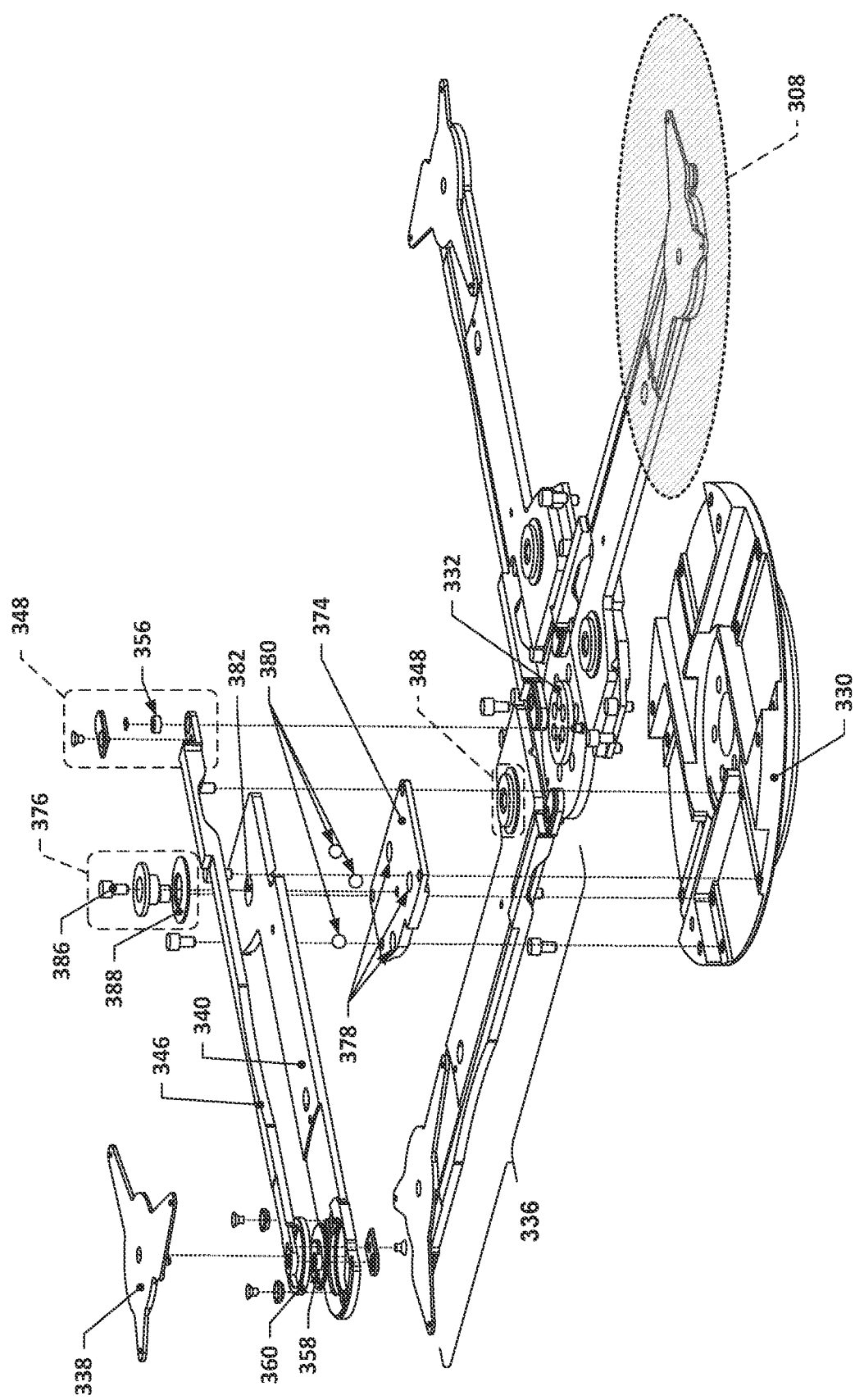
FIG. 4 depicts a perspective, partially-exploded view of the example rotational indexer of FIG. 3.

FIG. 4 depicts a perspective, partially-exploded view of the example rotational indexer of FIG. 3. As can be seen in FIG. 4, one of the indexer arm assemblies 336 is shown in an exploded fashion; the other indexer arm assemblies 336 are shown in their assembled states as they would be arranged when fastened to a first hub 3430 (only one indexer arm assembly 336 is numbered). For reference, one of the indexer arm assemblies s is shown supporting a wafer 308, which is shown as partially transparent and with a dotted edge so as to not obscure features of the indexer arm assembly 336. Each indexer arm assembly 336 may include an indexer arm 340 that has a proximal end 342 that is connected, either directly or indirectly, with the first hub 330. Each indexer arm assembly 336 may also include a wafer support 338 that is rotatably mounted to the distal end 344 of the indexer arm 340. The wafer support, may, for example, be a small plate or platform that is configured to support a semiconductor wafer. The wafer support 338 may be able to rotate about a rotational axis of the wafer support, e.g., an axis that passes through the center of a semiconductor wafer that the wafer support 338 is designed to support, relative to the indexer arm 340 that supports it.

Generally speaking, the first hub 330, and the indexer arm assemblies 336 attached thereto, may be rotatable about a rotational axis of the first hub 330 to move wafers 308 from station to station. In addition to such rotation, the indexer 302 may also include an actuation mechanism that may be configured to cause all of the wafer supports 338 to simultaneously rotate relative to the indexer arms 340 and about respective rotational axes located in the distal ends 344 of the indexer arms 340. The actuation mechanism may be further configured to cause all of the wafer supports 338 to rotate simultaneously responsive to a single mechanical input. For example, a common rotational drive shaft located in the center of the rotational indexer 302 may be connected with drive shafts extending along each indexer arm 340 through bevel or other types of gearing; each drive shaft may, in turn cause the wafer supports 338 to rotate responsive to rotation of the drive shaft. In an alternative implementation, flexible belts, e.g., thin stainless steel belts, may be looped between pulleys attached to each wafer support 338 and a common rotational drive shaft so that rotation of the drive shaft relative to the indexer arms 340 causes the wafer supports 338 to also rotate relative to the indexer arms 340.

In some implementations, the actuation mechanism may utilize an array of movable linkages to cause the wafer supports 338 to rotate relative to the indexer arms 340. The example rotational indexer 302 in FIGS. 3 and 4 includes such a mechanism. As can be seen in FIG. 4, the actuation mechanism of the rotational indexer 302 includes a second hub 332. The second hub 332 may be configured to rotate about the same rotational axis that the first hub 330 is configured to rotate about. The first hub 330 and the second hub 332 may be independently rotatable such that the first hub 330 and the second hub 332 may be placed in a variety of different angular orientations relative to one another.

In such an actuation mechanism, each indexer arm assembly 336 may further include a tie-rod 346 that extends along the length of the corresponding indexer arm 340. Each tie-rod 346 may have a proximal end 348 that is rotatably connected with the second hub 332 via a first rotatable interface 356 and a distal end 350 (see FIG. 5) that is rotatably connected with a corresponding wafer support 338 via a second rotatable interface 358. The first rotatable interface 356 and the second rotatable interfaces 358 may be located some distance from the center axis 352 and the rotational axes 354, respectively, so as to define a moment arm about each axis. The rotational axes 354 may, for example, be rotational axes for third rotatable interfaces 360, which may rotatably couple the wafer supports 338 to their respective indexer arms 340.

When relative rotational motion between the first hub 330 and the second hub 332 about the center axis 352 is induced, the tie-rods 346 are moved in a generally radial manner (there is some tangential motion as well as the tie-rods 346 move away from and then closer to the adjacent indexer arms 340) that causes the wafer supports 338 to which they are rotatably connected to rotate about the rotational axes 354 relative to the indexer arms 340 to which the wafer supports 338 are attached. When the relative rotational motion between the first hub 330 and the second hub 332 is non-existent, then the wafer supports 338 will remain fixed in position relative to the indexer arms 340.

Such a rotational indexer may thus be driven so as to provide rotation of the wafer supports 338 relative to the indexer arms 340 without any corresponding rotation of the indexer arms 340 (by rotating the second hub 332 while keeping the first hub 330 stationary), rotation of the indexer arms 340 about the center axis 352 without any corresponding rotation of the wafer supports 338 relative to the indexer arms 340 (by rotating the first hub 330 and the second hub 332 in synchrony (and by the same amount), and rotation of the indexer arms 340 about the center axis 352 with simultaneous rotation of the wafer supports 338 relative to the indexer arms 340 (by rotating the first hub 330 not in synchrony with the second hub 332, e.g., by rotating the first hub 330 about the center axis 352 while keeping the second hub 332 stationary or by rotating the first hub 330 and the second hub 332 about the center axis 352 at different rates).

In some implementations, such as in the depicted example, the distances between each of the first rotatable interfaces 356 and the center axis 352 may be equal to the distances between each of the second rotatable interfaces 358 and the corresponding rotational axes 354 may be equal such that the moment arms defined by the tie-rods 346 are the same. In such an implementation, the relative rotation between the wafer supports 338 and the indexer arms 340 may be the same as the relative rotation between the first hub 330 and the second hub 332. Such an implementation may be particularly efficient since this may cause each wafer to be kept in the same absolute orientation (relative to the semiconductor processing tool, for example) regardless of which processing station that wafer is moved to by the rotational indexer 302 when each wafer transfer from one station to the next is accomplished by rotating only the first hub 330 while keeping the second hub 332 stationary.

Figure 6:
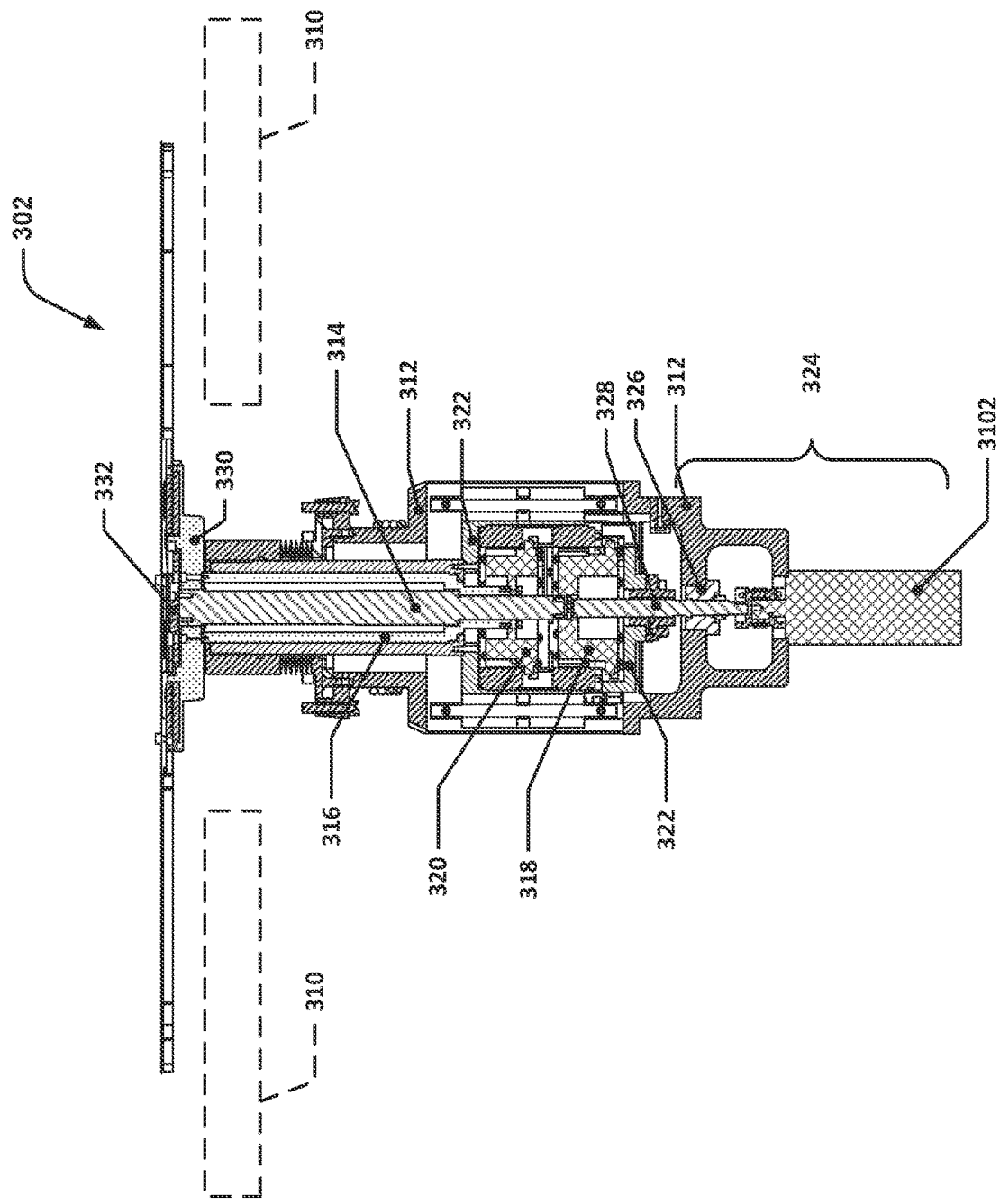
FIG. 6 depicts a side section view of the example rotational indexer of FIG. 3.

FIG. 6 depicts a side section view of the example rotational indexer of FIG. 3. As shown in FIG. 6, the rotational indexer 302 may include a base 312 that may be mounted in the semiconductor processing tool 300. The base 312 may house various systems that may be used to actuate the rotational indexer 302. For example, the base 312 may have a motor housing 322 that may house a first motor 318 and a second motor 320. The first motor 318 may be connected with the first hub 330 by a first shaft 314, and the second motor 320 may be connected with the second hub 332 by a second shaft 316. Thus, the first motor 318 may be actuated to rotate the first hub 330, and the second motor may be actuated to rotate the second hub 332.

In some implementations, the rotational indexer 302 may also be configured for vertical movement as well. For example, a z-axis drive system 324 may be provided to drive the motor housing 322, the first motor 318, the second motor 320, the first hub 330, and the second hub 332 up and down vertically, thereby causing the indexer arms 340 to move vertically. The z-axis drive system 324 may include, in some implementations, a third motor 3102 configured to rotate a threaded shaft 328 that passes through a ball-screw 326 attached to the motor housing 322, thereby causing vertical movement when the third motor 3102 is actuated.

In implementations having an actuation mechanism such as that discussed above in which the wafer supports 338 rotate relative to the indexer arms 340 about the axes 354 by the same amount that the first hub 330 and the second hub 332 rotate relative to one another, the first rotatable interfaces 356 that link the tie-rods 346 to the second hub 332 may, during such relative rotation between the first hub 330 and the second hub 332, be moved so as to be in the same position as an adjacent first rotatable interface 356 was in prior to such rotation. FIG. 7 depicts a detail view of the center of the example rotational indexer of FIG. 3, which is an example of such a rotational indexer, with some additional components removed, e.g., with an indexer arm assembly 336, the first hub 330 removed, and various other components omitted.

As shown in FIG. 7, the tie-rods 346 may further include an offset region 364. The offset regions 364 may extend along the length of the tie-rods 346, i.e., in a longitudinal direction, for some distance. Each offset region 364 may be considered to start at location that is a first longitudinal distance 368 from the rotational center axis of the first rotatable interface 356 for that offset region's tie-rod 346 and may considered to end at a location that is a second longitudinal distance 370 from the rotational center axis of the first rotatable interface 356 for that offset region's tie-rod 346. Generally speaking, the first longitudinal distance 368 and the second longitudinal distance 370 may be selected so as to be less than and greater than, respectively, a first distance 366 between the rotational center axes of adjacent first rotatable interfaces 356. As shown in FIG. 7, the first rotatable interfaces 356 are represented by dotted outlines, and a post 3100 that interfaces with the missing first rotatable interface 356 is depicted (the first rotatable interfaces 356 in this example are rotational bearing assemblies, e.g., ball bearings, roller bearings, or other similar devices).

Each offset region 364 may be configured such that the tie-rod 346 of which it is part does not contact or collide with the proximal end 348 of an adjacent tie-rod 346 during rotational motion as described above, i.e., when each first rotatable interface 356 is advanced in position to the location last occupied by an adjacent first rotatable interface 356. Thus, the tie-rod 346 may, in the offset region 364, include a jog or other deviation from the general shape of the tie-rod 346.

In the implementation shown in FIG. 7, for example, the offset region 364 includes a lowermost surface 390 (not shown in FIG. 7, but see FIG. 10) that is positioned at an elevation that is, when the rotational indexer is positioned with the center axis 352 in a vertical orientation and with the base 340 below the indexer arms 340, higher than an uppermost surface 362 of the proximal end 348 of the adjacent tie-rod 346 directly above the first rotatable interface 356 of that adjacent tie-rod 346. This allows the proximal ends 348 of the tie-rods 346 to pass underneath the offset regions 364 (without any of the tie-rods 346 contacting each other) of the adjacent tie-rods 346 when each first rotatable interface 356 is advanced in position to the location last occupied by an adjacent first rotatable interface 356. FIG. 8 is a detail view showing how the proximal end 348 of a tie-rod 346 may pass underneath the offset region 364 of another tie-rod 346.

The offset region concept may also be employed in a manner that is "horizontal" instead of "vertical." For example, FIG. 9 depicts such an implementation. As can be seen, the offset region 864 is offset from a nominal centerline (dash-dot-dot line in this Figure) of the tie-rod 846 by a distance D, which may be selected such that a proximal end 848 of an adjacent tie-rod 346 may be moved into the position shown without contacting the tie-rod 846 shown in FIG. 8 as having the offset region 864.

The rotational indexers with additional rotational axes disclosed herein may be particularly advantageous when used in certain types of semiconductor processing equipment. For example, in multi-station deposition or etch processing tools, there may be process non-uniformities in the wafers that are biased towards the center of the array of processing stations, e.g., towards the center axis 352.

If a conventional rotational indexer is used to move wafers from station to station in such a semiconductor processing tool, then the wafers may be subjected to such non-uniformities at each processing station and in the same manner, as the same edges of the wafers may be closest to the center axis 352 at every station. However, if a rotational indexer with additional rotational axes, as disclosed herein, is used to move wafers from station to station in such a semiconductor processing tool, then the wafers may be rotated from station to station such that a different edge or portion of the edge of the wafers may be closest to the center axis 352 at each station. This may help average out or mitigate the non-uniformities, thereby enhancing wafer processing quality.

If the rotational indexers with additional rotational axes discussed herein are used in certain contexts, e.g., in deposition or etch processing semiconductor processing tools, it may be advantageous in some such circumstances to include further features beyond those described above. For example, in some implementations, the indexer arms 340, the tie-rods 346, and/or the wafer supports 338 may be manufactured from a ceramic material, such as aluminum oxide, that has a low coefficient of thermal expansion, e.g., on the order of 8 µm/m/C, and that is generally resistant to corrosion or chemical attack. Deposition and etching operations may involve elevated temperatures or large temperature swings that cause the rotational indexer to heat up and experience thermal expansion. Due to the length of the indexer arms 340, such thermal expansion (or contraction, if there is cooling) may cause the wafers being supported by the indexer arms to be slightly misaligned with the rotational axes 354 of the wafer supports 338, which may, in turn, cause the wafers to further misalign when rotated about those rotational axes 354. While some degree of misalignment may be acceptable, the use of a ceramic or other material with a low coefficient of thermal expansion may allow such misalignment to be reduced, minimized, or otherwise kept to an acceptable level. In some cases, additional components in the indexer arm assemblies 336 may also be made from similar materials. For example, the first, second, and third rotatable interfaces 356, 358, and 360 may be ceramic ball bearings, ceramic roller bearings, or ceramic thrust bearings, e.g., bearings with inner and outer races, as well as rolling elements, that are made from a ceramic material. Other elements of the indexer arm assemblies 336 may also be made of ceramic material, e.g., screws, bearing caps, retainer cups, and so forth. The first hub 330 and the second hub 332 may also be made of ceramic material, but may, in many implementations, be made of a more robust and easier to manufacture material, e.g., stainless steel or aluminum. Such metal-based materials may be more susceptible to chemical attack, but may also be more isolated from active species used in semiconductor processing due to the fact that the first hub 330 and the second hub 332 may remain in the center of the processing chamber housing 306 and do not pass through the processing stations 304 at any time, regardless of the rotational movement undergone.

In such implementations, the indexer arm assemblies 336 may be connected with the first hub 330 via a corresponding number of mounting interfaces. Such mounting interfaces may allow for the indexer arm assemblies 336 to be easily installed, aligned with the center axis 352, and secured in place relative to the first hub 330.

FIG. 5 depicts another perspective, partially-exploded view of the example rotational indexer of FIG. 3. FIG. 10 depicts a perspective, partially-exploded view of the example rotational indexer of FIG. 3 showing the underside of the example rotational indexer. In FIGS. 5 and 10, details of one example mounting interface are depicted (such features are also visible in FIG. 4).

In FIGS. 5 and 10, a mounting plate 374 may be provided that includes a plurality, e.g., three, conical recesses 378 that are arrayed about a central mounting location, e.g., a threaded hole. In the depicted example, the three conical recesses 378 that are depicted are arranged in an evenly spaced circular pattern about the central mounting location.

Each conical recess 378 may have a spherical bearing 380 nestled within it; the spherical bearings may be made of the same material as either the indexer arms 340 or the mounting plate 374, or may be made of a different material, if desired.

The indexer arms 340 may include an aperture 382 (see FIG. 4) that may be configured to receive a tensionable interface 376 that may be connected with the mounting plate 374. The tensionable interface 376 may be tightened to draw the indexer arms 340 closer to the mounting plate 374, thereby compressing the spheres 380 in between the two components. The tensionable interface 376 may, for example, include a threaded component 386, e.g., a screw or bolt, and a spring 388, e.g., a Belleville washer, and potentially an adapter, such as that pictured, to transfer the compressive force generated by the threaded component 386 to the spring 388. Thus, when the threaded component 386 is screwed into the mounting plate 374, the spring 388 may be compressed, thereby exerting compressing force on the indexer arm 340. Of course, the spring 388 may not be used in some implementations, although its presence may reduce the risk of overtightening and may also act to help spread the compressive load onto the indexer arm. For a ceramic indexer arm 340, this may be particularly advantageous since it may reduce the risk of initiating cracks in the ceramic components.

To aid in properly aligning the indexer arm assemblies 336 relative to the mounting plate, the undersides of the indexer arms 340 that contact the spheres 380 may include a plurality of grooves 384 that may be configured to receive the spheres 380 when the assembly is bolted together. Each groove 384 for a particular indexer arm 340 may, for example, follow a radial path extending outwards from the center of the aperture 382 so that during thermal expansion or contraction of the mounting plate 374 relative to the indexer arm 340, the spheres 380 may slide radially inward or outward along the grooves from a common point (the center of the aperture 382) without binding and without causing the indexer arm 340 to move off-center from, for example, the center of the tensionable interface. Since the mounting plate 374 may be made of aluminum or stainless steel in some implementations, for example, and the indexer arms 340 may be made of a ceramic material in such implementations, interfaces such as the above groove/sphere/conical recess interfaces may allow for such components to experience different thermal expansion behavior (due to the different coefficients of thermal expansion in play) without causing misalignment or undue stress. Such a kinematic mount may be constructed using ceramic spheres such that if there is sliding motion between the spheres 380 and the grooves 384, but little or no motion between the spheres 380 and the conical recesses 378 (the conical recesses 378 having a greater contact area with the spheres 380 than the grooves 384, thereby seeing a generally higher friction loading (assuming that the coefficients of friction are generally equivalent) relative to the conical recesses 378 than to the grooves 384), thereby preventing sliding/abrasive movement between ceramic and non-ceramic, e.g., metal, parts.

In the depicted example, the indexer arm assemblies 336 may be mounted to the mounting plates 374, and the resulting assemblies may then be mounted to the first hub 330. Before bolts that secure the mounting plates 374 to the first hub 330 are tightened, a fixture may be mounted to the rotational indexer 302. The fixture, for example, may have a centering feature that allows it to be centered on the first hub 330 or the second hub 332, as well as arms or other structure that extends out at least some distance along the indexer arms 340. The fixture may be secured to the rotational indexer 302 in a centered position, and then each indexer arm assembly 336 may be adjusted so that alignment features, e.g., holes, on the indexer arm assemblies 336 interface with corresponding alignment features on the fixture. After each indexer arm assembly 336 has been aligned with the fixture, the mounting plate 374 for that indexer arm assembly may be clamped in place by tightening the fasteners that secure it to the first hub 330. Once all of the indexer arm assemblies 336 are installed and secured in place, the fixture may be removed before using the rotational indexer 302. In other implementations, other types of mounting interfaces may be used to secure the indexer arm assemblies 336 to the first hub 330.

Also visible in FIGS. 5 and 10 are a stop mechanism that may include, for example, a stop 394 and an arc-shaped groove or recess 392. The stop mechanism may allow the first hub 330 and the second hub 332 to only rotate relative to one another by a predefined amount, e.g., 90° to 95° in the case of a four-arm indexer, to prevent over-rotation that might cause the actuation mechanism to bind or be damaged.

FIGS. 11-A through 11-E depict the example rotational indexer of FIG. 3 through various states of actuation of the rotatable wafer supports located at the distal ends of the indexer arms. In this example, the first hub 330 is kept stationary and the second hub 332 is rotated in a clockwise manner (by 22.5° between each consecutive pair of Figures). The outlines of the positions of the moving parts in each previous Figure are depicted in dashed or broken lines. It will be understood that if the first hub 330 is rotated while the second hub 332 is held stationary, the wafer supports 338 will rotate in exactly the same manner relative to the indexer arms 340 at the same time that all of the indexer arms 340 rotate about the center axis 352. Thus, wafers supported by the wafer supports 338 may be simultaneously moved from station to station and rotated during each such movement so that the absolute angular orientation of the wafers relative to the word coordinate system remains the same.

In some implementations, particularly for rotational indexers used in semiconductor processing equipment that performs deposition operations, additional features may be provided to route a purge gas, e.g., argon, helium, or nitrogen, to the various rotatable interfaces. By allowing purge gas to flow through each rotatable interface, processing gases that might otherwise cause deposition to occur on the bearings may be flushed out of or away from the rotatable interfaces, thereby preventing deposition on the surfaces of such components and prolonging the lifespan of the rotatable interfaces.

Figure 12:
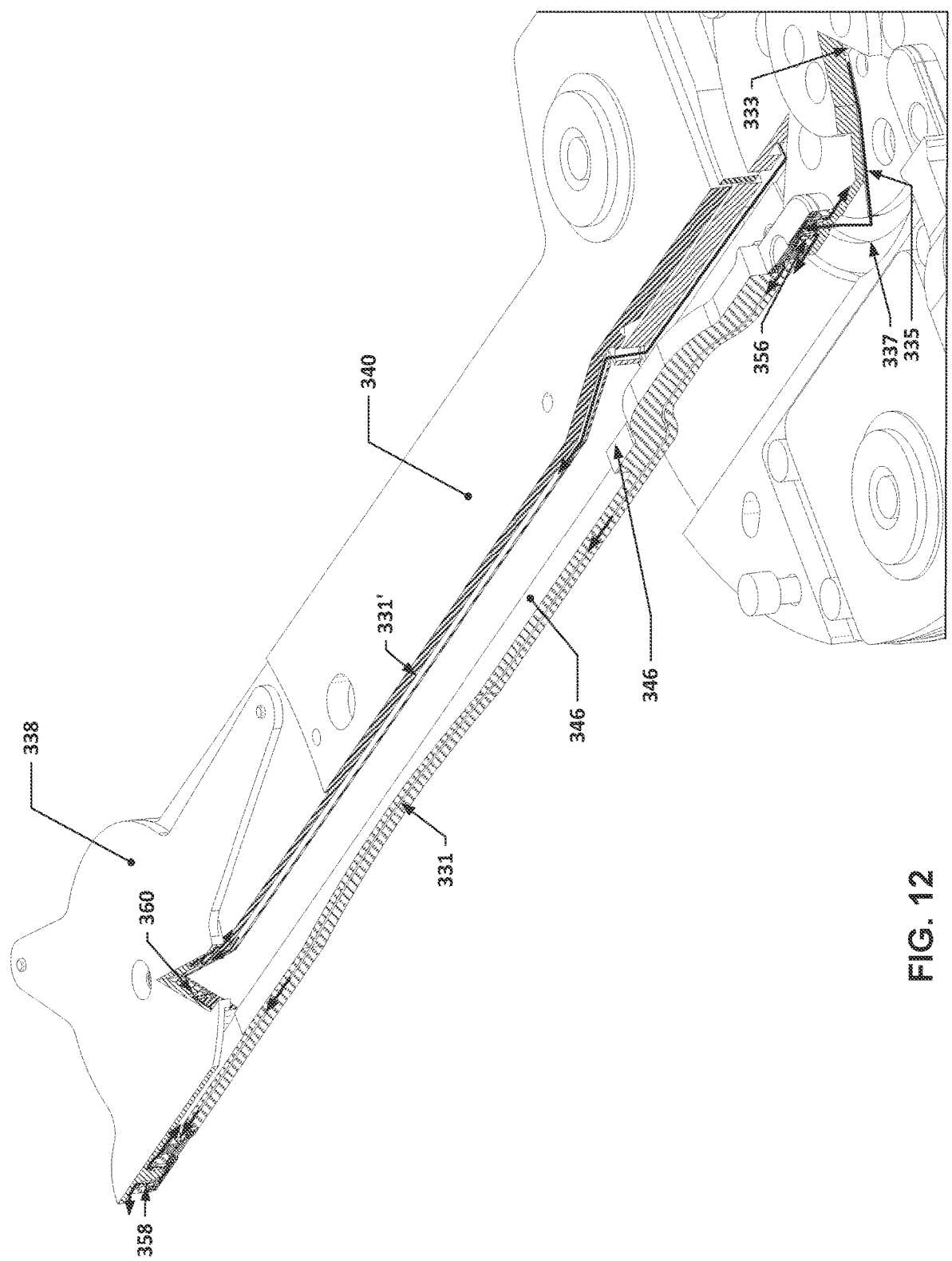
FIG. 12 depicts a partial cutaway view of an example rotational indexer having internal purge gas flow passages.

FIG. 12 depicts part of a rotational indexer with various portions of some components cut away. In FIG. 12, the second shaft (not numbered, but see FIG. 6) may be hollow and may be used as a conduit to route purge gas to the second hub 332 at location 333. The second hub 332 may have one or more conduits or gas pathways 335, 337 that may fluidically connect with (or otherwise bias purge gas to flow towards) various ports or gas flow passages. For example, the posts 3100 that may connect the second hub 332 with the first rotational interfaces 356 may have holes in them that fluidically connect with the purge gas flow paths. This may allow purge gas to be flowed up through the posts 3100 and into the proximal ends 348 of the tie-rods 346, where some of the purge gas may flow through the first rotational interface 356 (such as between the balls or rollers of the bearing) and the remainder of the purge gas flowing through the posts 3100 may flow into passages 331 internal to the tie-rods 336. The passages 331 that are within the tie-rods 336 may extend along the entire length of the tie-rods 336 until they exit into the distal ends 350 of the tie-rods 336, thereby allowing the purge gas to also be flowed through the second rotatable interface 358. In FIG. 12, heavy black lines and arrows are used to show representative flow paths for the purge gas; dotted lines may be used in some locations to show general flow path directions in situations where the flow path itself has departed from the cutaway planes.

The indexer arms 340 may also have internal gas flow passages 331' that may be provided with purge gas via passages or channels in the first hub 330 and the second hub 332. Such purge gas may be flowed to the third rotatable interfaces 360 located at the distal ends 344 of the indexer arms 340 in order to protect the third rotatable interfaces 360 from unwanted deposition as well.

It is to be understood that other arrangements of gas flow passages and conduits may be used as well, and are considered to be within the scope of this disclosure.

Figure 13:
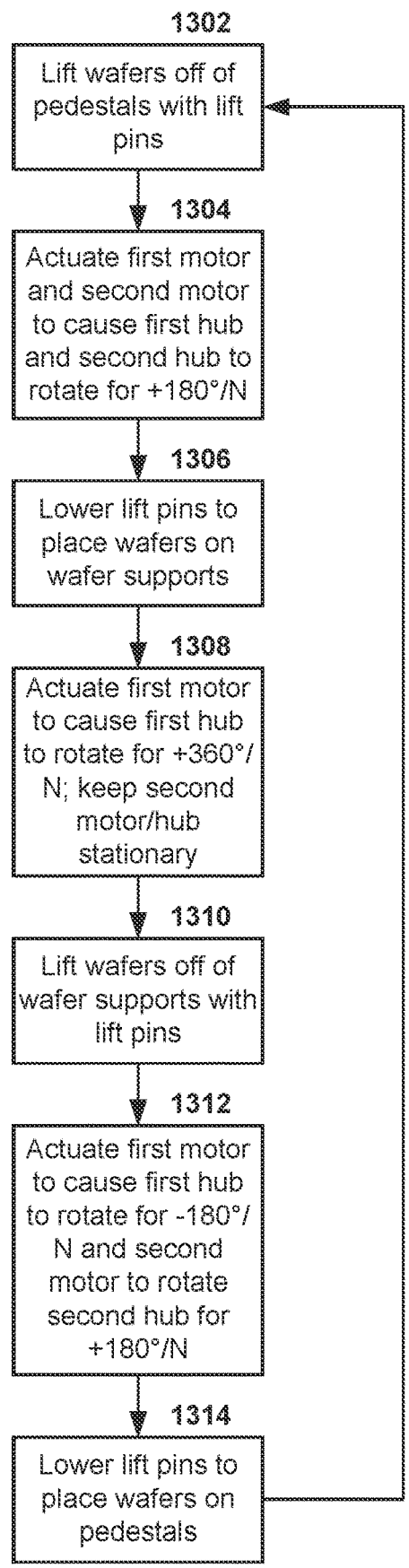
FIG. 13 is a flow diagram for an example technique for operating a rotational indexer according to some examples described herein.

FIG. 13 depicts an example flow diagram for one technique for controlling a rotational indexer with additional rotational axes; the rotational indexer in question includes N equally-spaced indexer arms, where N is an integer greater than 1. The technique in FIG. 13 represents movements taken to sequentially advance a set of wafers from one station to the next in a semiconductor processing tool using such a rotational indexer. The technique may be repeated to perform further wafer advancement.

In block 1302, the wafers that are on each pedestal may be lifted off their respective pedestals, e.g., by activating a lift-pin system (in which pins located within each pedestal move upwards, or the pedestal moves downwards, in order to cause the wafer to be lifted off the pedestal upper surface to allow the wafer supports of the rotational indexer to be moved underneath the wafers.

In block 1304, the first motor and the second motor may be actuated so as to both rotate for +180°/N (or to cause the first hub to rotate for this amount); this assumes that each indexer arm is stowed midway between each station so as to not interfere with wafer processing operations when the rotational indexer is not in use. Such a rotation may cause the indexer arms and their wafer supports to move to locations where the wafer supports are underneath the wafers.

In block 1306, the lift pins may be lowered (or the rotational indexer elevated) to cause the wafers to be lifted off the lift pins by the wafer supports of the rotation indexer.

In block 1308, the first motor may be actuated so as to cause the first hub to rotate for 360°/N while the second motor is inactive or otherwise unactuated. As a result, the indexer arms may be rotated to move the wafers from their stations to the next adjacent stations while at the same time, the wafer supports may rotate relative to the indexer arms by the same amount in the same direction so as to maintain the wafers in the same absolute angular orientation.

In block 1310, the lift pins may be used to lift the wafers off of the wafer supports (or the rotational indexer may be lowered to cause the wafer to rest on the lift pins and be lifted off the wafer supports).

In block 1312, the first motor may be actuated to cause the first hub to rotate for 180°/N in the opposite direction as previous rotations while, at the same time, the second motor may be actuated to cause the second hub to rotate for 180°/N in the same direction as previous rotations. Thus, the relative rotational movement between the first and second hubs will be −360°/N, which may cause the wafer supports to rotate into the same angular position relative to indexer arms that they were in in between blocks 1302 and 1304, effectively resetting their positioning. At the same time, the indexer arms may be moved into their "stowed" positions midway between each pair of processing stations.

Once the indexer arms have cleared the processing stations, block 1314 may be performed to lower the wafers onto the pedestals for a further semiconductor processing operation. As noted above, this process may be repeated as desired to continue to advance the wafers through the array of processing stations.

It will be understood, as discussed earlier, that there are many ways to control the rotational indexer to perform wafer transfers between stations. The first hub and the second hub may be driven so as to move simultaneously, move sequentially, move at different rates and/or in different directions, and so forth. It will be appreciated that all such different combinations of actuating the motors for operating the rotational indexers described herein are considered to be within the scope of this application.

Figure 14:
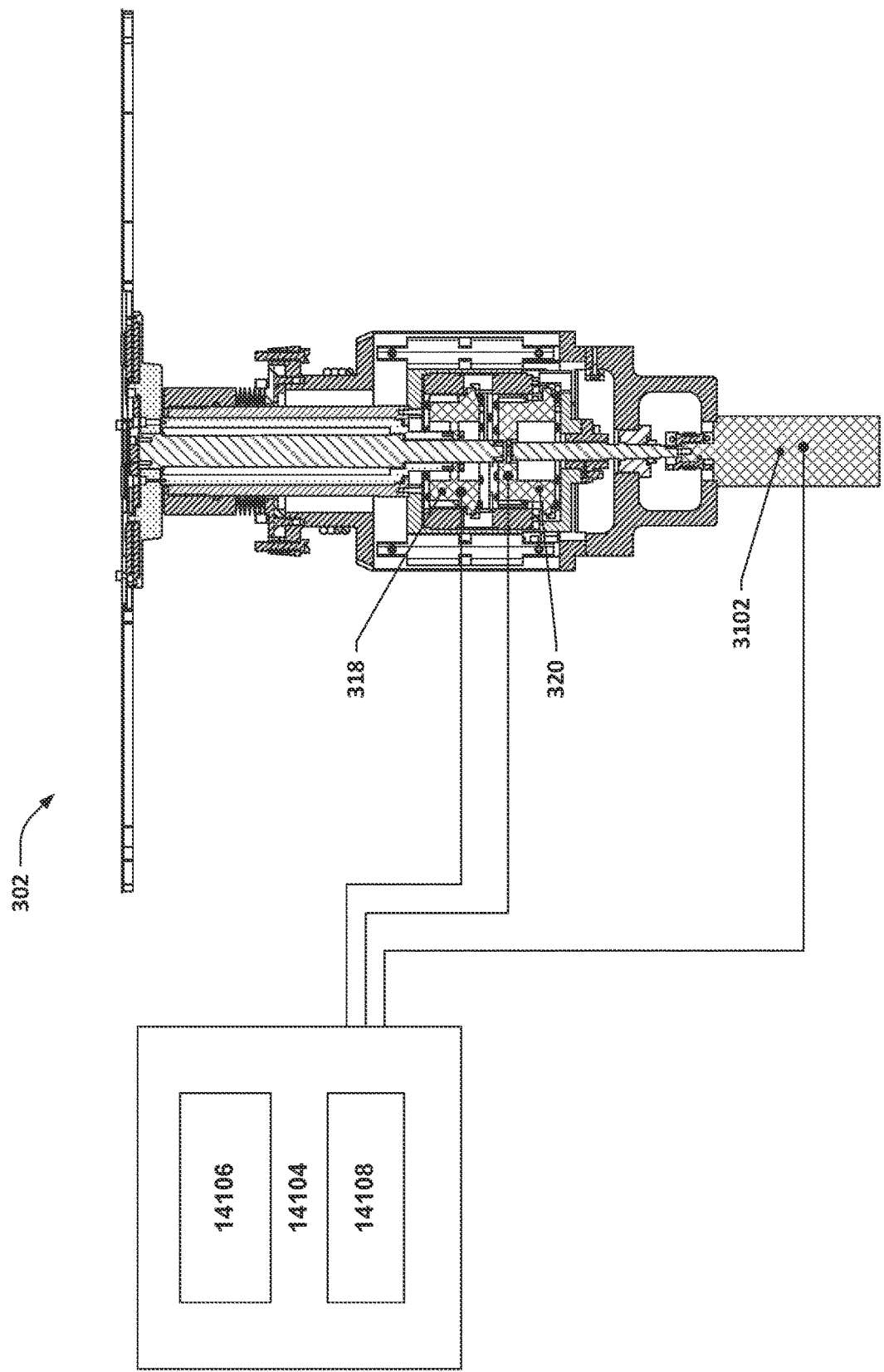
FIG. 14 depicts a system diagram for an example controller for the rotational indexer of FIG. 3.

As discussed above, in some implementations, a controller may be part of the rotational indexer systems discussed herein. FIG. 14 depicts a schematic of an example controller 14104 with one or more processors 14106 and a memory 14108, which may be integrated with electronics for controlling the operation of the first motor 318, the second motor 320, and, if present, the third motor 3102 during wafer transfer operations. The controller, depending on the processing requirements and/or the type of system, may be programmed to control any of the processes disclosed herein, such as processes for controlling the rotational indexer, as well as other processes or parameters not discussed herein, such as the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a chamber and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example rotational indexers according to the present disclosure may be mounted in or part of semiconductor processing tools with a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

It is to be understood that the term "set," unless further qualified, refers to a set of one or more items—it does not require that multiple items be present unless there is further language that implies that it does. For example, a "set of two or more items" would be understood to have, at a minimum, two items in it. In contrast, a "set of one or more items" would be understood to potentially only have one item in it. In a similar vein, it is to be understood that the term "each" may be used herein to refer to each member of a set, even if the set only includes one member. The term "each" may also be used in the same manner with implied sets, e.g., situations in which the term set is not used but other language implies that there is a set. For example, "each item of the one or more items" is to be understood to be equivalent to "each item in the set of one or more items."

It is to be understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. An apparatus comprising:
   a chamber having N processing stations located therewithin, the N processing stations arranged in a first circular array about a center axis and N being a quantity greater than or equal to two;
   a plurality of pedestals arranged in a second circular array about the center axis, each pedestal located at a respective one of the N processing stations and configured to support a semiconductor wafer during wafer processing operations performed within the chamber;
   a rotational indexer configured to transport semiconductor wafers between the pedestals of the N processing stations, the rotational indexer having:
   a first hub that is configured to be rotatable about the center axis and relative to the chamber; and
   N indexer arm assemblies, each indexer arm assembly including a) a wafer support and b) an indexer arm having a proximal end fixedly connected with the first hub and a distal end supporting the wafer support, wherein the wafer support of each indexer arm assembly is configured to be rotatable relative to the indexer arm of that indexer arm assembly and about a rotational axis of the wafer support, wherein the rotational axis of the wafer support is fixed in location with respect to the indexer arm of that indexer arm assembly and located at the distal end of the indexer arm of that indexer arm assembly.

2. The apparatus of claim 1, wherein there are four indexer arm assemblies arranged in a third circular array about the first hub.

3. The apparatus of claim 1, wherein the indexer arms are rotationally fixed with respect to the first hub.

4. The apparatus of claim 1, wherein the N wafer supports are kinematically linked so as to rotate in unison relative to the N indexer arms when rotated relative to the N indexer arms.

5. The apparatus of claim 4, further comprising an actuation mechanism that includes a second hub that is configured to be rotatable about the center axis relative to the first hub, wherein:
   each indexer arm assembly further includes a corresponding linkage, each linkage including a tie-rod with a proximal end that is rotatably connected with the second hub by a first rotatable interface and a distal end that is rotatably connected with the wafer support of the corresponding indexer arm assembly by a second rotatable interface, and
   the actuation mechanism and indexer arm assemblies are configured such that relative rotation between the first hub and the second hub about the center axis causes the tie-rods to translate in a predominantly radial manner relative to the center axis, thereby causing each tie-rod to rotate the wafer support to which that tie-rod is rotatably connected relative to the indexer arms and about the rotational axis of that wafer support.

6. The apparatus of claim 5, wherein:
the first hub and the second hub are configured to be rotatable relative to each other from a first relative rotational position to a second relative rotational position,
each of the wafer supports, when the first hub and the second hub are in the first relative rotational position, is in a third relative rotational position with respect to the indexer arms,
each of the wafer supports, when the first hub and the second hub are in the second relative rotational position, is in a fourth relative rotational position with respect to the indexer arms,
the third relative rotational positions and the fourth relative rotational positions are 360°/N out of phase with one another.

7. The apparatus of claim 5, wherein:
the first hub and the second hub are configured to be rotatable relative to each other from a first relative rotational position to a second relative rotational position,
N equals 4,
each of the wafer supports, when the first hub and the second hub are in the first relative rotational position, is in a third relative rotational position with respect to the indexer arms,
each of the wafer supports, when the first hub and the second hub are in the second relative rotational position, is in a fourth relative rotational position with respect to the indexer arms,
the third relative rotational positions and the fourth relative rotational positions are 90° out of phase with one another.

8. The apparatus of claim 7, further comprising a stop mechanism, wherein the stop mechanism is configured to limit relative rotational motion between the first hub and the second hub to between 90° and 95°.

9. The apparatus of claim 7, wherein:
the proximal end of each tie-rod has an uppermost surface directly above the first rotatable interface for that tie-rod, each first rotatable interface is horizontally spaced apart from the nearest other first rotatable interface by a first distance,
each tie-rod includes an offset region extending between a first longitudinal distance from a rotational center of the first rotatable interface for that tie-rod and a second longitudinal distance from the rotational center of the first rotatable interface for that tie-rod,
the first longitudinal distances are less than the first distances and the second longitudinal distances are greater than the first distances, and
the offset region of each tie-rod has a lowermost surface that is higher than the uppermost surface of the distal end of the tie-rod from an adjacent indexer arm assembly, thereby allowing the distal end of the tie-rod from the adjacent indexer arm assembly to pass underneath that tie-rod when the first hub and the second hub are in the first relative rotational position.

10. The apparatus of claim 5, further comprising:
a first motor configured to cause the first hub to rotate relative to the chamber when actuated;
a second motor configured to cause the second hub to rotate relative to the chamber when actuated; and
a controller having a memory and one or more processors, wherein:
the memory and the one or more processors are communicatively connected,
the one or more processors are configured to control the first motor and the second motor, and
the memory stores computer-executable instructions for controlling the one or more processors to cause one or more of the first motor, the second motor, and the first motor and the second motor to be selectively actuated to cause:
the first hub and the indexer arm assemblies to rotate relative to the chamber such that each wafer support moves from a corresponding one of the processing stations to a neighboring processing station of the processing stations,
first relative rotational motion between the first hub and the actuation mechanism such that each wafer support rotates about the rotational axis of that wafer support and relative to the first hub by a first amount in a first direction during movement from processing station to processing station, while the wafer supports are resident at each processing station, or during both movement from processing station to processing station and while the wafer supports are resident at each processing station, and
second relative rotational motion between the first hub and the actuation mechanism such that each wafer support rotates about the rotational axis of that wafer support and relative to the first hub by a first amount in a second direction opposite the first direction during movement from processing station to processing station, while the wafer supports are resident at each processing station, or during both movement from processing station to processing station and while the wafer supports are resident at each processing station.

11. The apparatus of claim 10, further comprising:
a motor housing containing a first motor and a second motor and supporting the first hub via a first hub rotational interface; and
a z-axis drive system configured to translate the motor housing along a vertical axis responsive to actuation of the z-axis drive system.

12. The apparatus of claim 5, wherein each tie rod has an internal gas flow passage that is configured to flow gas from the proximal end thereof to the distal end thereof when the gas is introduced at the proximal end thereof.

13. The apparatus of claim 5, wherein at least one of the indexer arm, the tie-rod, and the wafer support is made of a ceramic material.

14. The apparatus of claim 5, wherein:
each indexer arm assembly includes a third rotatable interface that rotatably connects the wafer support for that indexer arm assembly with the indexer arm for that indexer arm assembly, and
the first rotatable interfaces, the second rotatable interfaces, and the third rotatable interfaces are all ceramic ball bearings.

15. The apparatus of claim 1, wherein:
the first hub includes a separate mounting interface for each indexer arm assembly;
each mounting interface includes a tensionable interface and three conical recesses arranged around the tensionable interface;
a sphere is nestled in each conical recess; and each indexer arm includes:
- an aperture through which a portion of the tensionable interface of a corresponding mounting interface of the mounting interfaces protrudes, and
- three grooves radiating outward relative to the aperture, wherein each of the spheres of the corresponding mounting interface is also nestled in a corresponding groove of that indexer arm and the tensionable interface of the corresponding mounting interface is configured to compress the spheres of the corresponding mounting interface between a corresponding one of the indexer arms the corresponding mounting interface.

16. The apparatus of claim 15, wherein one groove in each mounting interface extends in a direction parallel to an axis that intersects with, and is perpendicular to, the center axis.

17. The apparatus of claim 15, wherein the tens ionable interface associated with each indexer arm comprises a threaded component and a spring that is configured to compress that indexer arm against the spheres interposed between that indexer arm and the mounting interface that connects that indexer arm with the first hub when the threaded component is placed in tension and provides a compressive load to the spring.

18. The apparatus of claim 17, wherein the spring of each tensionable interface is a Belleville washer.

19. The apparatus of claim 17, wherein, for each indexer arm:
- the corresponding aperture is located in the proximal end of the indexer arm,
- the indexer arm is fixedly connected with the first hub by way of the corresponding mounting interface, and
- each mounting interface fixedly connects the corresponding indexer arm with the first hub such that a) the corresponding indexer arm and the first hub can undergo different amounts of thermal expansion without direct sliding contact between the indexer arm and the first hub and b) the corresponding indexer arm is held fixedly in place relative to the first hub, at least in part, by the compression exerted on the indexer arm by the threaded component and the spring of the tensionable interface of the corresponding mounting interface.

20. The apparatus of claim 15, wherein the indexer arms are made of a ceramic material and the first hub is made of a metal.

* * * * *